United States Patent
Iwamoto et al.

(10) Patent No.: US 8,519,764 B2
(45) Date of Patent: Aug. 27, 2013

(54) SHIFT REGISTER, SCANNING SIGNAL LINE DRIVE CIRCUIT PROVIDED WITH SAME, AND DISPLAY DEVICE

(75) Inventors: Akihisa Iwamoto, Osaka (JP); Hideki Morii, Osaka (JP); Takayuki Mizunaga, Osaka (JP); Kei Ikuta, Yonago (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/501,198

(22) PCT Filed: Jul. 15, 2010

(86) PCT No.: PCT/JP2010/061945
§ 371 (c)(1),
(2), (4) Date: Apr. 10, 2012

(87) PCT Pub. No.: WO2011/055570
PCT Pub. Date: May 12, 2011

(65) Prior Publication Data
US 2012/0194489 A1 Aug. 2, 2012

(30) Foreign Application Priority Data

Nov. 4, 2009 (JP) ................................. 2009-252688

(51) Int. Cl.
*H03K 3/00* (2006.01)
(52) U.S. Cl.
USPC ............ 327/199; 327/208; 327/212; 345/204
(58) Field of Classification Search
USPC ............. 327/64, 91, 144, 154, 166, 199, 200, 327/201, 208, 210, 211, 212, 213, 223, 225
See application file for complete search history.

(56) References Cited

U.S. PATENT DOCUMENTS

| 5,708,455 A | * | 1/1998 | Maekawa ...................... 345/100 |
| 5,859,630 A | | 1/1999 | Huq |
| 6,778,626 B2 | | 8/2004 | Yu |

(Continued)

FOREIGN PATENT DOCUMENTS

| JP | 2001506044 A | 5/2001 |
| JP | 2004227751 A | 8/2004 |

(Continued)

OTHER PUBLICATIONS

International Search Report (PCT/ISA/210).

*Primary Examiner* — Lincoln Donovan
*Assistant Examiner* — Jung H. Kim
(74) *Attorney, Agent, or Firm* — Harness, Dickey & Pierce, P.L.C.

(57) ABSTRACT

Each stage that constitutes a shift register includes an output-control thin-film transistor for increasing a potential of a scanning signal based on a first clock (CKA), two thin-film transistors for increasing a potential of a first node connected to a gate terminal of the output-control thin-film transistor, based on a scanning signal outputted from a pre-stage/a latter stage, and two thin-film transistors for decreasing a potential of the first node, based on a scanning signal outputted from a third stage after/a third stage before a stage concerned. The shift register operates based on four-phase clock signals, including two-phase clock signals that are provided to odd-order stages and two-phase clock signals that are provided to even-order stages, of which phases are shifted by 90 degrees from each other.

26 Claims, 28 Drawing Sheets

(56) References Cited

U.S. PATENT DOCUMENTS

| | | | |
|---|---|---|---|
| 7,873,140 B2 * | 1/2011 | Moon et al. | 377/76 |
| 2004/0150610 A1 | 8/2004 | Zebedee et al. | |
| 2005/0008114 A1 | 1/2005 | Moon | |
| 2006/0267911 A1 | 11/2006 | Jang | |
| 2008/0219401 A1 | 9/2008 | Tobita | |
| 2010/0321372 A1 | 12/2010 | Iwamoto et al. | |
| 2011/0018845 A1 * | 1/2011 | Mizunaga et al. | 345/204 |
| 2011/0134090 A1 | 6/2011 | Iwamoto et al. | |
| 2011/0199354 A1 | 8/2011 | Iwase et al. | |
| 2011/0291712 A1 * | 12/2011 | Tobita | 327/144 |
| 2012/0200544 A1 * | 8/2012 | Iwamoto et al. | 345/204 |
| 2012/0218245 A1 * | 8/2012 | Morii et al. | 345/211 |
| 2012/0235020 A1 * | 9/2012 | Decker | 250/208.1 |

FOREIGN PATENT DOCUMENTS

| | | |
|---|---|---|
| JP | 2005-050502 | 2/2005 |
| JP | 2006-331633 A | 12/2006 |
| JP | 2008217902 A | 9/2008 |
| JP | 2008-276849 | 11/2008 |
| JP | 2009-223051 | 10/2009 |
| JP | 2010192019 A | 9/2010 |
| JP | 2011-055569 A | 3/2011 |
| WO | WO-2009104306 A1 | 2/2008 |
| WO | WO-2010-050262 A1 | 5/2010 |
| WO | WO 2010/067641 | 6/2010 |

* cited by examiner

US 8,519,764 B2

SHIFT REGISTER, SCANNING SIGNAL LINE DRIVE CIRCUIT PROVIDED WITH SAME, AND DISPLAY DEVICE

TECHNICAL FIELD

The present invention relates to a shift register that is provided in a drive circuit of an active matrix-type display device and more particularly, to a shift register capable of bi-directionally shifting an input signal.

BACKGROUND ART

In recent years, to reduce a size of a display device and to reduce cost, there is being progressed development of a display device in which both a display unit including a pixel circuit and a gate driver for driving a gate bus line (scanning signal line) are formed on the same substrate. FIG. 23 is a block diagram showing an example of a configuration of a gate driver of such a conventional display device. In addition, FIG. 24 is a circuit diagram showing an example of a configuration of one stage of a shift register that constitutes the gate driver.

As shown in FIG. 23, the gate driver includes a shift register 90 of plural stages (the same number of stages as that of gate bus lines). Each stage of the shift register 90 is a bistable circuit that is in either one of two states (a first state and a second state) at each time point, and outputs a signal indicating this state, as a scanning signal. In this way, the shift register 90 includes plural bistable circuits SR. Each bistable circuit SR is provided with input terminals for receiving two-phase clock signals CKA (hereinafter, referred to as a "first clock") and CKB (hereinafter, referred to as a "second clock") respectively, an input terminal for receiving a low-level power source voltage VSS, an input terminal for receiving a set signal SET, an input terminal for receiving a reset signal RESET, and an output terminal for outputting a scanning signal GOUT. The scanning signal GOUT outputted from each stage (bistable circuit) is provided to a next stage as a set signal, and is also provided to a pre-stage as a reset signal.

As shown in FIG. 24, the bistable circuit includes four thin-film transistors T91, T92, T93, and T94, and a capacitor C9. The bistable circuit also includes four input terminals 91 to 94 and an output terminal 95, in addition to the input terminal for the low-level power source voltage VSS. A source terminal of the thin-film transistor T91, a drain terminal of the thin-film transistor T92, and a gate terminal of the thin-film transistor T93 are connected to each other. Note that a region (wiring) in which these terminals are connected to each other is called a "netA" for convenience.

In the thin-film transistor T91, a gate terminal and a drain terminal are connected to the input terminal 91 (that is, in a diode connection), and the source terminal is connected to the netA. In the thin-film transistor T92, a gate terminal is connected to the input terminal 92, the drain terminal is connected to the netA, and a source terminal is connected to the power source voltage VSS. In the thin-film transistor T93, the gate terminal is connected to the netA, a drain terminal is connected to the input terminal 93, and a source terminal is connected to the output terminal 95. In the thin-film transistor T94, a gate terminal is connected to the input terminal 94, a drain terminal is connected to the output terminal 95, and a source terminal is connected to the power source voltage VSS. In the capacitor C9, one end is connected to the netA, and the other end is connected to the output terminal 95.

In the configuration as described above, each stage (bistable circuit) of the shift register 90 operates as follows. Note that FIG. 25 is a timing chart for describing the operation of each stage of the shift register 90. The first clock CKA that becomes at a high level at every other horizontal scanning period is provided to the input terminal 93. The second clock CKB of which a phase is shifted by 180 degrees from a phase of the first clock CKA is provided to the input terminal 94. During a period before a time point t0, a potential of the netA and a potential of the scanning signal GOUT (a potential of the output terminal 95) are at a low level.

When reaching the time point t0, a pulse of the set signal SET is provided to the input terminal 91. Because the thin-film transistor T91 is in a diode connection as shown in FIG. 24, the thin-film transistor T91 becomes in an on state by the pulse of this set signal SET, and the capacitor C9 is charged. As a result, the potential of the netA changes from the low level to a high level, and the thin-film transistor T93 becomes in an on state. In this case, the first clock CKA is at a low level during a period from the time point t0 to the time point t1. Therefore, during this period, the scanning signal GOUT is maintained at the low level. Also, during this period, since the reset signal RESET is at a low level, the thin-film transistor T92 is maintained in an off state. Therefore, the potential of the netA does not decrease during this period.

When reaching the time point t1, the first clock CKA changes from the low level to the high level. In this case, because the thin-film transistor T93 is in an on state, a potential of the input terminal 93 increases and the potential of the output terminal 95 also increases. Here, as shown in FIG. 24, because the capacitor C9 is provided between the netA and the output terminal 95, the potential of the netA also increases (the netA is bootstrapped) with the increase in the potential of the output terminal 95. As a result, a large voltage is applied to the thin-film transistor T93, and the potential of the scanning signal GOUT increases to a high-level potential of the first clock CKA. Consequently, a gate bus line connected to the output terminal 95 of the bistable circuit becomes in a selected state. Note that, during a period from the time point t1 to a time point t2, the second clock CKB is at a low level. Therefore, because the thin-film transistor T94 is maintained in an off state, the potential of the scanning signal GOUT does not decrease during this period.

When reaching the time point t2, the first clock CKA changes from the high level to the low level. Accordingly, the potential of the output terminal 95 decreases with the decrease in the potential of the input terminal 93, and the potential of the netA also decreases via the capacitor C9. Moreover, at the time point t2, a pulse of the reset signal RESET is provided to the input terminal 92. Accordingly, the thin-film transistor T92 becomes in an on state. As a result, the potential of the netA changes from the high level to the low level. Moreover, at the time point t2, the second clock CKB changes from the low level to a high level. Accordingly, the thin-film transistor T94 becomes in an on state. As a result, the potential of the output terminal 95, that is, the potential of the scanning signal GOUT, becomes at the low level.

As described above, the scanning signal GOUT outputted from each stage (bistable circuit) is provided to the next stage as the set signal SET, as shown in FIG. 23. In this manner, the plural gate bus lines provided in the display device sequentially become in the selected state in each horizontal scanning period, and writing is performed to a pixel capacitance within the pixel circuit for each row.

Regarding the display device as described above, there is proposed a configuration that makes it possible to switch between scanning orders (scanning directions) of gate bus lines. FIG. 26 is a block diagram showing a configuration of a shift register disclosed in U.S. Pat. No. 6,778,626. In this shift register, there are provided circuits (circuits for inputting a select signal SW as a signal corresponding to a scanning order) 310, 312, and 314 for switching between scanning orders, in each stage. Scanning orders are changed over by the select signal SW that is provided to these circuits 310, 312, and 314.

FIG. 27 is a block diagram showing a configuration of a shift register disclosed in Japanese Unexamined Patent Application Publication No. 2001-506044. In this shift register, a set signal from a pre-stage or from a next stage is provided to each stage, and a reset signal from a second pre-stage or from a second next stage is provided to each stage. By providing the configuration as described above, it is possible to switch between scanning orders of gate bus lines, without using a select signal for switching between scanning orders.

An object of making it possible to switch between scanning orders of gate bus lines is as follows. When a user builds a liquid crystal display module into a television at a shipment destination, for example, a build-in direction is sometimes different depending on a shipment destination (up and down directions become opposite, for example). In this case, when scanning orders can be changed over at a shipment destination, an image display desired by the user can be performed. There is also proposed a television that makes it possible to watch an image reflected from a mirror. In this case, when scanning orders can be changed over, the user can watch an image in a normal state, even when the image on a screen is an image reflected from a mirror.

PRIOR ART DOCUMENTS

Patent Documents

[Patent Document 1] U.S. Pat. No. 6,778,626
[Patent Document 2] Japanese Unexamined Patent Application Publication No. 2001-506044

SUMMARY OF INVENTION

Problems to be Solved by the Invention

However, according to the configuration described in U.S. Pat. No. 6,778,626, as described above, the circuits 310, 312, and 314 for switching between scanning orders are necessary at each stage of the shift register. Therefore, it causes increase in a circuit area and increase in current consumption and also increase in cost. Further, the circuits 310, 312, and 314 for switching between scanning orders are configured to change over a switch by the select signal SW. According to this configuration, transistors that constitute the switches are maintained in an on state during an operation of the display device. Therefore, when a thin-film transistor and the like that use amorphous silicon are employed as the switches, there occurs a shift of a threshold voltage of transistors at a high-temperature aging time, and it sometimes causes an abnormal operation. Accordingly, high reliability is not secured.

In recent years, furthermore, an increase in a panel size and an increase in a high resolution are being progressed, and it becomes important to prevent a shortage of charge to a pixel capacitance. Concerning this aspect, according to the shift register disclosed in Japanese Unexamined Patent Application Publication No. 2001-506044, there is no period in which plural gate bus lines are simultaneously selected (see FIG. 28). Therefore, at the time of a forward scanning, for example, it is not possible to perform preliminary charge (precharge) to a (k+1)-th row during a period when charge is being performed to a k-th line. To make it possible to perform precharge in this shift register, the shift register needs to be configured to use six or more clock signals.

An object of the present invention is to realize a shift register that can switch between scanning orders of scanning signal lines, while suppressing an increase in a circuit area, an increase in current consumption, and a shortage of charge to a pixel capacitance.

Means for Solving the Problems

A first aspect of the present invention is directed to a shift register comprising a plurality of bistable circuits each having a first state and a second state and connected in series with each other, in which the plurality of bistable circuits sequentially become in the first state based on at least four-phase clock signals including two-phase clock signals which are provided as a first clock signal and a second clock signal to odd-order stage bistable circuits out of the plurality of bistable circuits, and two-phase clock signals which are provided as the first clock signal and the second clock signal to even-order stage bistable circuits out of the plurality of bistable circuits, wherein each bistable circuit includes:
an output node that outputs a state signal indicating either one of the first state and the second state;
an output-control switching element in which the first clock signal is provided to a second electrode, and a third electrode is connected to the output node;
a first first-node charge unit for charging a first node connected to a first electrode of the output-control switching element based on a state signal outputted from a pre-stage bistable circuit of each bistable circuit concerned;
a second first-node charge unit for charging the first node based on a state signal outputted from a next-stage bistable circuit of each bistable circuit concerned;
a first first-node discharge unit for discharging the first node based on a state signal outputted from a bistable circuit of a third stage after each bistable circuit concerned, and
a second first-node discharge unit for discharging the first node based on a state signal outputted from a bistable circuit of a third stage before each bistable circuit concerned.

According to a second aspect of the present invention, in the first aspect of the present invention,
a phase of the first clock signal and a phase of the second clock signal are shifted by 180 degrees from each other.

According to a third aspect of the present invention, in the first aspect of the present invention,
a phase of two-phase clock signals provided to the odd-order stage bistable circuits and a phase of two-phase clock signals provided to the even-order stage bistable circuits are shifted by 90 degrees from each other.

According to a fourth aspect of the present invention, in the first aspect of the present invention,
a timing when the first clock signal changes from a high level to a low level is the same as a timing when the second clock signal changes from a low level to a high level, and also a timing when the first clock signal changes from the low level to the high level is the same as a timing when the second clock signal changes from the high level to the low level.

According to a fifth aspect of the present invention, in the first aspect of the present invention,
on-duty of each of the four-phase clock signals is 50%.

According to a sixth aspect of the present invention, in the first aspect of the present invention, in each bistable circuit, the first first-node charge unit includes a first switching element in which a state signal outputted from a pre-stage bistable circuit of each bistable circuit concerned is provided to a first electrode and a second electrode, and a third electrode is connected to the first node, the second first-node charge unit includes a second switching element in which a state signal outputted from a next-stage bistable circuit of each bistable circuit concerned is provided to a first electrode and a second electrode, and a third electrode is connected to the first node, the first first-node discharge unit includes a third switching element in which a state signal outputted from a bistable circuit of a third stage after each bistable circuit concerned is provided to a first electrode, a second electrode is connected to the first node, and a low-level potential is provided to a third electrode, and the second first-node discharge unit includes a fourth switching element in which a state signal outputted from a bistable circuit of a third stage before each bistable circuit concerned is provided to a first electrode, a second electrode is connected to the first node, and a low-level potential is provided to a third electrode.

According to a seventh aspect of the present invention, in the first aspect of the present invention, each bistable circuit further includes:

a fifth switching element in which a second electrode is connected to the first node, and a low-level potential is provided to a third electrode; and a second node control unit that controls a potential of a second node connected to a first electrode of the fifth switching element, based on the second clock signal and a potential of the first node.

According to an eighth aspect of the present invention, in the seventh aspect of the present invention, the second node control unit includes:

a sixth switching element in which the second clock signal is provided to a first electrode and a second electrode, and a third electrode is connected to the second node; and a seventh switching element in which a first electrode is connected to the first node, a second electrode is connected to the second node, and a low-level potential is provided to a third electrode.

According to a ninth aspect of the present invention, in the first aspect of the present invention, the odd-order stage bistable circuits receive two-phase clock signals that are provided to the even-order stage bistable circuits, as a third clock signal and a fourth clock signal, respectively, the even-order stage bistable circuits receive two-phase clock signals that are provided to the odd-order stage bistable circuits, as the third clock signal and the fourth clock signal, respectively, and each bistable circuit further includes:

an eighth switching element in which a second electrode is connected to the first node, and a low-level potential is provided to a third electrode;

a third-node control unit that controls a potential of a third node connected to a first electrode of the eighth switching element, based on the third clock signal and a potential of the first node;

an eleventh switching element in which a second electrode is connected to the first node, and a low-level potential is provided to a third electrode; and a fourth node control unit that controls a potential of a fourth node connected to a first electrode of the eleventh switching element, based on the fourth clock signal and a potential of the first node.

According to a tenth aspect of the present invention, in the ninth aspect of the present invention, the third node control unit includes a ninth switching element in which the third clock signal is provided to a first electrode and a second electrode, and a third electrode is connected to the third node, and a tenth switching element in which a first electrode is connected to the first node, a second electrode is connected to the third node, and a low-level potential is provided to a third electrode, and the fourth node control unit includes a twelfth switching element in which the fourth clock signal is provided to a first electrode and a second electrode, and a third electrode is connected to the fourth node, and a thirteenth switching element in which a first electrode is connected to the first node, a second electrode is connected to the fourth node, and a low-level potential is provided to a third electrode.

According to an eleventh aspect of the present invention, in the first aspect of the present invention, three first-stage-side control signals for discharging the first node included in each of bistable circuits of a first-stage, a second-stage, and a third-stage out of the plurality of bistable circuits, by the second first-node discharge unit respectively, are provided from an outside, and three last-stage-side control signals for discharging the first node included in each of bistable circuits of a last-stage, a stage before the last stage, and a second-stage before the last stage out of the plurality of bistable circuits, by the first first-node discharge unit respectively, are provided from an outside.

According to a twelfth aspect of the present invention, in the eleventh aspect of the present invention, two first-stage-side control signals out of the three first-stage-side control signals are realized by one signal, and two last-stage-side control signals out of the three last-stage-side control signals are realized by one signal.

According to a thirteenth aspect of the present invention, in the twelfth aspect of the present invention, in each of bistable circuits of a first-stage, a second-stage, and a third-stage out of the plurality of bistable circuits, a change of the first clock signal from a low level to a high level is suppressed, during a period until the first node is discharged by the second first-node discharge unit, after the first node is charged by the second first-node charge unit, and in each of bistable circuits of a last-stage, a stage before the last stage, and a second-stage before the last stage out of the plurality of bistable circuits, a change of the first clock signal from a low level to a high level is suppressed, during a period until the first node is discharged by the first first-node discharge unit, after the first node is charged by the first first-node charge unit.

According to a fourteenth aspect of the present invention, in the first aspect of the present invention, any one of bistable circuits of a first-stage, a second-stage, and a third-stage out of the plurality of bistable circuits includes a fifteenth switching element in which the first-stage-side control signal is provided to a first electrode, a second electrode is connected to the output node, and a low-level potential is provided to a third electrode, and any one of bistable circuits of a last-stage, a stage before the last stage, and a second-stage before the last stage out of the plurality of bistable circuits includes a sixteenth switching element in which the last-stage-side control signal is provided to a first electrode, a second electrode is connected to the output node, and a low-level potential is provided to a third electrode.

According to a fifteenth aspect of the present invention, in the first aspect of the present invention, each bistable circuit further includes a fourteenth switching element in which the second clock signal is provided to a first electrode, a second electrode is connected to the output node, and a low-level potential is provided to a third electrode.

According to a sixteenth aspect of the present invention, in the first aspect of the present invention, each bistable circuit further includes a capacitor in which one end is connected to the first node, and the other end is connected to the output node.

According to a seventeenth aspect of the present invention, in the first aspect of the present invention, each bistable circuit further includes a seventeenth switching element in which a state signal outputted from a bistable circuit of a second stage or a third stage after each bistable circuit concerned is provided to a first electrode, a second electrode is connected to the output node, and a low-level potential is provided to a third electrode, and an eighteenth switching element in which a state signal outputted from a bistable circuit of a second stage or a third stage before each bistable circuit concerned is provided to a first electrode, a second electrode is connected to the output node, and a low-level potential is provided to a third electrode.

According to an eighteenth aspect of the present invention, in the first aspect of the present invention, the shift register is formed by using amorphous silicon.

According to a nineteenth aspect of the present invention, in the first aspect of the present invention, the shift register is formed by using microcrystalline silicon.

According to a twentieth aspect of the present invention, in the first aspect of the present invention, the shift register is formed by using polycrystalline silicon.

According to a twenty-first aspect of the present invention, in the first aspect of the present invention, the shift register is formed by using an oxide semiconductor.

A twenty-second aspect of the present invention is directed to a scanning signal line drive circuit of a display device, for driving a plurality of scanning signal lines that are provided in a display unit, comprising:

the shift register according to the first aspect of the present invention, wherein the plurality of bistable circuits are provided so as to have a one-to-one correspondence with the plurality of scanning signal lines, and each bistable circuit provides a state signal outputted from the output node, to a scanning signal line corresponding to each bistable circuit concerned as a scanning signal.

A twenty-third aspect of the present invention is directed to a display device comprising the scanning signal line drive circuit according to the twenty-second aspect of the present invention, including the display unit.

According to a twenty-fourth aspect of the present invention, in the twenty-third aspect of the present invention, a shift register including the plurality of bistable circuits is provided at both one end side and the other end side of the display unit, respectively.

According to a twenty-fifth aspect of the present invention, in the twenty-third aspect of the present invention, the odd-order stage bistable circuits are provided at one end side of the display unit, and the even-order stage bistable circuits are provided at the other end side of the display unit.

Effects of the Invention

According to the first aspect of the present invention, to each stage (bistable circuit) of the shift register, the state signal outputted from the pre-stage and the state signal outputted from the next stage are provided as signals to charge the first node connected to the first electrode (typically, gate electrode) of the output-control switching element for controlling the potential (the potential of the state signal outputted from each stage) of the output node, and the state signal outputted from the third stage before the stage concerned and the state signal outputted from the third stage after the stage concerned are provided as signals to discharge the first node. That is, the state signal outputted from each stage of the shift register has a function to charge the first nodes of the pre-stage and the next stage, and also has a function to discharge first nodes of the third stage before and the third stage after the stage concerned. Further, the first clock signal that cyclically repeats the high-level potential and the low-level potential is provided to the second electrode (typically, drain electrode) of the output-control switching element. Therefore, when the first node is charged in the first stage of the shift register at the beginning, a state signal outputted from each stage of the shift register becomes in a first state, in an order of a forward direction (the order of "a first stage to a last stage"). On the other hand, when the first node is charged in the last stage of the shift register at the beginning, a state signal outputted from each stage of the shift register becomes in the first state, in an order of a backward direction (the order of "the last stage to the first stage"). In this way, the shift register capable of switching shift directions can be realized, without including configurations ("a configuration for changing over a switch by a select signal", "a drive circuit and a signal wiring for the select signal") that are conventionally necessary to change a shift direction. Therefore, when a display device has a configuration capable of switching between scanning orders of scanning signal lines, for example, an increase in a circuit area, an increase in current consumption, and an increase in cost can be suppressed. Further, because a switch for changing over between scanning orders (shift direction) becomes unnecessary, occurrence of an erroneous operation attributable to a shift of a threshold voltage of a switch (transistor) at a high-temperature aging time is suppressed.

According to the second aspect of the present invention, an effect similar to that of the first aspect is obtained.

According to the third aspect of the present invention, phases of two-phase clock signals that are provided to odd-order stages and two-phase clock signals that are provided to even-order stages are shifted by 90 degrees from each other. Therefore, a charge time to a pixel capacitance is uniformized, and occurrence of a display failure attributable to a charge difference is suppressed.

According to the fourth aspect of the present invention, because the change timing of the first clock signal and the change timing of the second clock signal become the same, noise of the state signal outputted from the bistable circuit is reduced. Further, because a charge time to a pixel capacitance becomes long, occurrence of a display failure attributable to a charge shortage is effectively suppressed.

According to the fifth aspect of the present invention, on-duty of each clock signal is 50%. Therefore, it is possible to provide a period when plural scanning signal lines are simultaneously selected. In this case, preliminary charge (precharge) is performed to a pixel capacitance during a first half period of the period when each scanning signal line is being selected, and main charge is performed to a pixel capacitance during a latter half period. Therefore, a sufficient charge time is secured, and lowering of the display quality attributable to a shortage of charge to a pixel capacitance is suppressed.

According to the sixth aspect of the present invention, an effect similar to that of the first aspect of the present invention is obtained, in a configuration that the switching elements are included in the first first-node charging unit, the second first-node charging unit, the first first-node discharging unit, and the second first-node discharging unit.

According to the seventh aspect of the present invention, during the period when the potential of the first node is at the low level, the potential of the second node for controlling the potential of the first node can be set to the high level every predetermined period. Therefore, during the period when the potential of the first node is at the low level, the fifth switching element becomes in an on state every predetermined period, and the potential of the first node is pulled to a lower potential. Consequently, even when a shift of a threshold voltage of an output-control switching element occurs due to high-temperature aging and also when a leakage current in the switching element becomes large, for example, the potential of the first node can be securely set to the low level every predetermined period, and output of an abnormal pulse from an output node can be suppressed.

According to the eighth aspect of the present invention, an effect similar to that of the seventh aspect of the present invention is obtained, in a configuration that the switching element is included in the second node control unit.

According to the ninth aspect of the present invention, during the period when the potential of the first node is at the low level, potentials of the third node and the fourth node for controlling the potential of the first node can be set at a high level every predetermined period. In this case, the potential of the third node and the potential of the fourth node are controlled based on different clock signals. Accordingly, the potential of the first node can be pulled to a lower potential during a greater part, for example, of the period when the potential of the first node is at the low level. Consequently, even when a shift of a threshold voltage of an output-control switching element occurs due to high-temperature aging and also when a leakage current in the switching element becomes large, for example, the potential of the first node can be fixed to a low level, and output of an abnormal pulse from an output node can be effectively suppressed.

According to the tenth aspect of the present invention, an effect similar to that of the ninth aspect of the present invention is obtained, in a configuration that the switching elements are included in the third node control unit and the fourth node control unit.

According to the eleventh aspect of the present invention, first nodes of the first stage, the second stage, the third stage, the second stage before the last stage, the stage before the last stage, and the last state are discharged by the control signal provided from the outside.

According to the twelfth aspect of the present invention, when the shift operation is performed in the order of the forward direction, first nodes of two stages out of the last stage, the stage before the last stage, and the second stage before the last stage are discharged based on the same signal. When the shift operation is performed in the order of the backward direction, first nodes of two stages out of the first stage, the second stage, and the third stage are discharged based on the same signal. Therefore, signal wirings that are necessary to discharge the first nodes are decreased, and an effect of reduction of a circuit area, reduction of current consumption, and cost reduction are enhanced.

According to the thirteenth aspect of the present invention, an unnecessary increase in potentials of first nodes is suppressed and lowering of the display quality is suppressed, in the first stage, the second stage, the third stage, the second stage before the last stage, the stage before the last stage, and the last stage.

According to the fourteenth aspect of the present invention, potentials of the state signal can be set to a low level based on a control signal provided from the outside, in the first stage, the second stage, the third stage, the second stage before the last stage, the stage before the last stage, and the last stage.

According to the fifteenth aspect of the present invention, even when an off-leak occurs in the output-control switching element, since the potential of the output node becomes at a low level based on the second clock signal, output of an abnormal pulse from the output node can be effectively suppressed.

According to the sixteenth aspect of the present invention, when the potential of the output node increases, the potential of the first node increases via the capacitor (the first node is bootstrapped). Therefore, during the period when the bistable circuit needs to be maintained in the first state, reduction of the potential of the first node is suppressed, and a large voltage is provided to the first electrode of the output-control switching element. Accordingly, the waveform of the state signal outputted from the output node is stabilized.

According to the seventeenth aspect of the present invention, when the shift operation is performed in the order of the forward direction, the potential of the output node is set to a low level based on the state signal outputted from the second stage after each stage or from the third stage after each stage, and when the shift operation is performed in the order of the backward direction, the potential of the output node is set to a low level based on the state signal outputted from the second stage before each stage or from the third stage before each stage. Accordingly, the potential of the state signal can be more securely decreased to a low level.

According to the eighteenth aspect of the present invention, an effect similar to that of the first aspect of the present invention is obtained, in the shift register formed by using amorphous silicon.

According to the nineteenth aspect of the present invention, an effect similar to that of the first aspect of the present invention is obtained, in the shift register formed by using microcrystalline silicon.

According to the twentieth aspect of the present invention, an effect similar to that of the first aspect of the present invention is obtained, in the shift register formed by using polycrystalline silicon.

According to the twenty-first aspect of the present invention, an effect similar to that of the first aspect of the present invention is obtained, in the shift register formed by using an oxide semiconductor.

According to the twenty-second aspect of the present invention, the scanning signal line drive circuit including the shift register capable of obtaining an effect similar to that of the first aspect of the present invention is realized.

According to the twenty-third aspect of the present invention, the display device including the scanning signal line drive circuit capable of obtaining an effect similar to that of the twenty-second aspect of the present invention is realized.

According to the twenty-fourth aspect of the present invention, charge is performed to one scanning signal line from the both sides of the display unit. Therefore, lowering of the display quality attributable to a charge shortage is suppressed.

According to the twenty-fifth aspect of the present invention, a size per one stage of the shift register can be set to substantially a half size, in comparison with a size in a configuration that the bistable circuit constituting the shift register is provided at only one side of the display unit. Accordingly, an area that is necessary as a picture-frame of a panel can be reduced, and reduction in sizes of various products can be realized.

MODE FOR CARRYING OUT THE INVENTION

Hereinafter, embodiments of the present invention are described with reference to the accompanying drawings. In the following description, a gate terminal (gate electrode) of a thin-film transistor corresponds to a first electrode, a drain terminal (drain electrode) corresponds to a second electrode, and a source terminal (source electrode) corresponds to a third electrode.

1. First Embodiment 1.1 An Overall Configuration and an Operation

Figure 2:
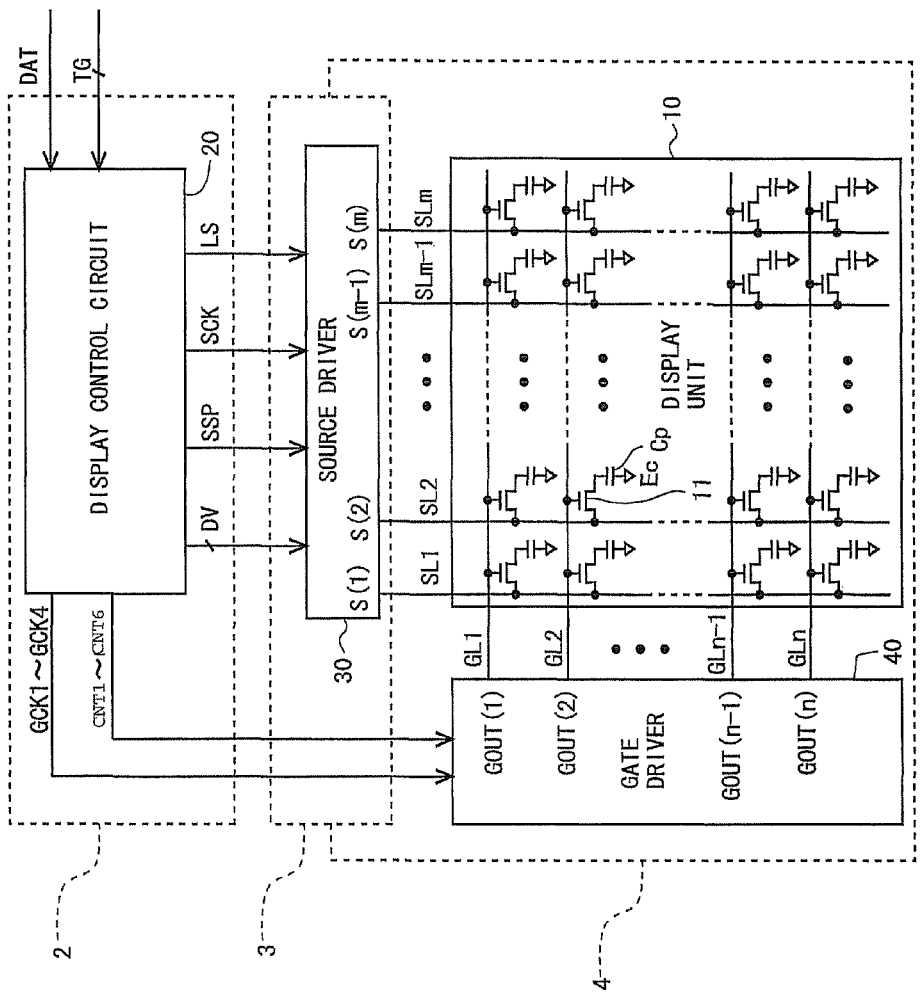
FIG. 2 is a block diagram showing an overall configuration of a liquid crystal display device in the first embodiment.

FIG. 2 is a block diagram showing an overall configuration of an active matrix-type liquid crystal display device according to a first embodiment of the present invention. As shown in FIG. 2, this liquid crystal display device includes a display unit 10, a display control circuit 20, a source driver (video signal line drive circuit) 30, and a gate driver (scanning signal line drive circuit) 40. The display control circuit 20 is formed on a control substrate 2. The source driver 30 is formed on a flexible substrate 3. The gate driver 40 is formed on a display panel 4 that includes the display unit 10, by using amorphous silicon, polycrystalline silicon, microcrystalline silicon, an oxide semiconductor (IGZO, for example), and the like. In other words, in the present embodiment, the gate driver 40 is monolithically configured.

The display unit 10 includes plural (m) source bus lines (video signal lines) SL1 to SLm, plural (n) gate bus lines (scanning signal lines) GL1 to GLn, and plural (n×m) pixel formation portions that are provided corresponding to intersections between the source bus lines SL1 to SLm and the gate bus lines GL1 to GLn, respectively.

The plural pixel formation portions are arranged in a matrix form and constitute a pixel array. Each pixel formation portion includes a thin-film transistor (TFT) 11 that is a switching element in which a gate terminal is connected to a gate bus line that passes a corresponding intersection and a source terminal is connected to a source bus line that passes the corresponding intersection, a pixel electrode connected to the drain terminal of the thin-film transistor 11, a common electrode Ec that is a counter electrode provided so as to be shared by the plural pixel formation portions, and a liquid crystal layer that is provided so as to be shared by the plural pixel formation portions and that is sandwiched between the pixel electrode and the common electrode Ec. A pixel capacitance Cp is configured by a liquid crystal capacitance formed by the pixel electrode and the common electrode Ec. Note that usually, auxiliary capacitances are provided in parallel with the liquid crystal capacitance, to securely hold a voltage in the pixel capacitance Cp. However, because the auxiliary capacitances are not directly related to the present invention, the description and depiction thereof are omitted.

The display control circuit 20 receives a timing signal group TG such as a horizontal synchronization signal and a vertical synchronization signal, and an image signal DAT, which are transmitted from the outside, and outputs a digital video signal DV, and a source start pulse signal SSP, a source clock signal SCK, a latch strobe signal LS, first to sixth scanning control signals CNT1 to CNT6, and first to fourth gate clock signals GCK1 to GCK4, for controlling an image display in the display unit 10.

The source driver 30 receives the digital video signal DV, the source start pulse signal SSP, the source clock signal SCK, and the latch strobe signal LS that are outputted from the display control circuit 20, and applies driving video signals S(1) to S(m) to the source bus lines SL1 to SLm, respectively.

The gate driver 40 repeats application of active scanning signals GOUT(1) to GOUT(n) to the gate bus lines GL1 to GLn in cycles of one vertical scanning period as a cycle, based on the first to sixth scanning control signals CNT1 to CNT6 and the first to fourth gate clock signals GCK1 to GCK4 that are outputted from the display control circuit 20. In the present embodiment, the forward scanning (scanning in the order of "GL1, GL2, . . . , GLn-1, GLn") and the backward scanning (scanning in the order of "GLn, GLn-1, GL2, GL1") are changed over to each other based on a timing of occurrence of pulses of the first to sixth scanning control signals CNT1 to CNT6. Note that the gate driver 40 is described in detail later.

In a manner as described above, the driving video signals S(1) to S(m) are applied to the source bus lines SL1 to SLm, respectively, and the scanning signals GOUT(1) to GOUT(n) are applied to the gate bus lines GL1 to GLn, respectively, so that an image based on the image signal DAT transmitted from the outside is displayed on the display unit 10.

1.2. A Configuration of the Gate Driver

Figure 3:
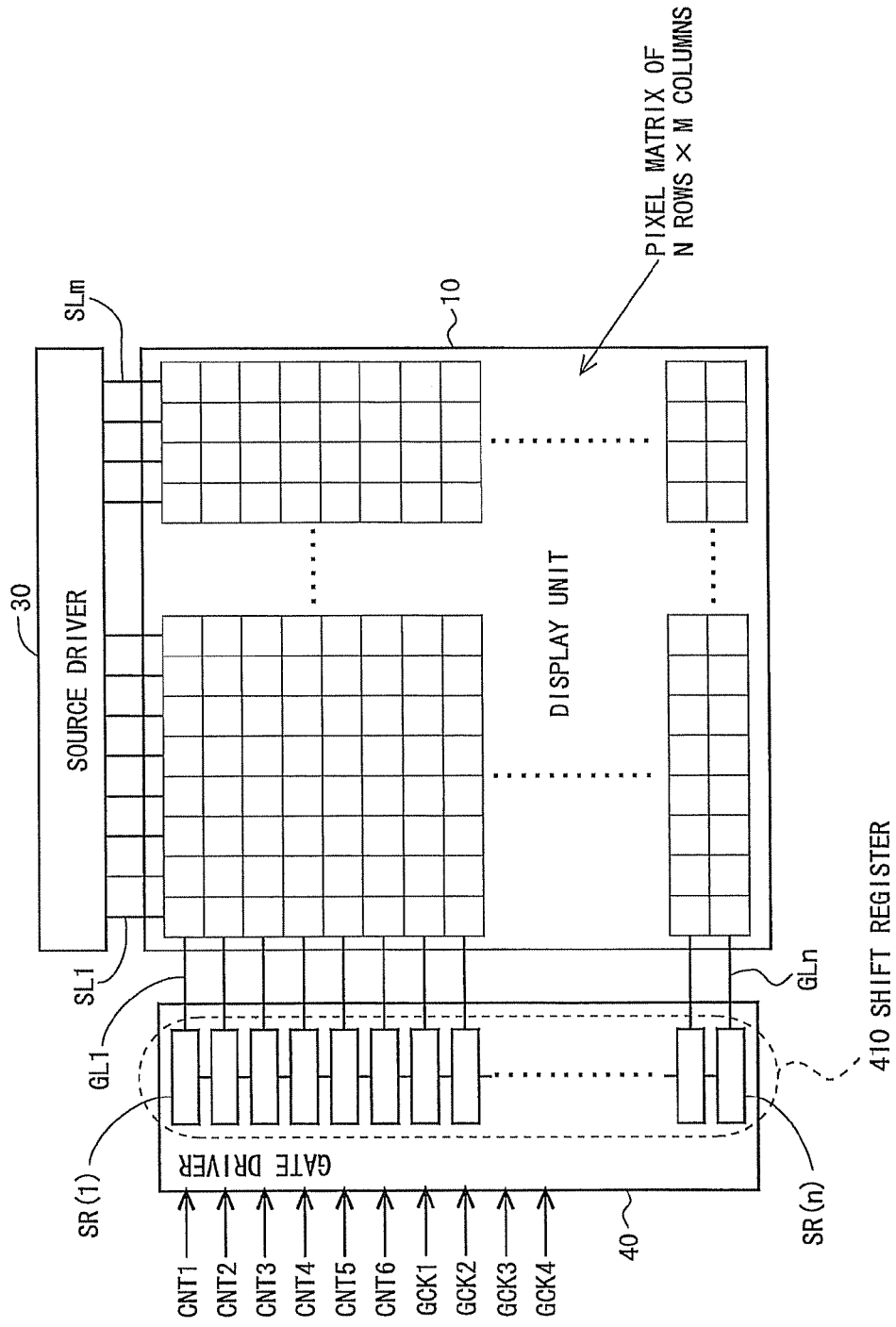
FIG. 3 is a block diagram for describing a configuration of a gate driver in the first embodiment.
Figure 4:
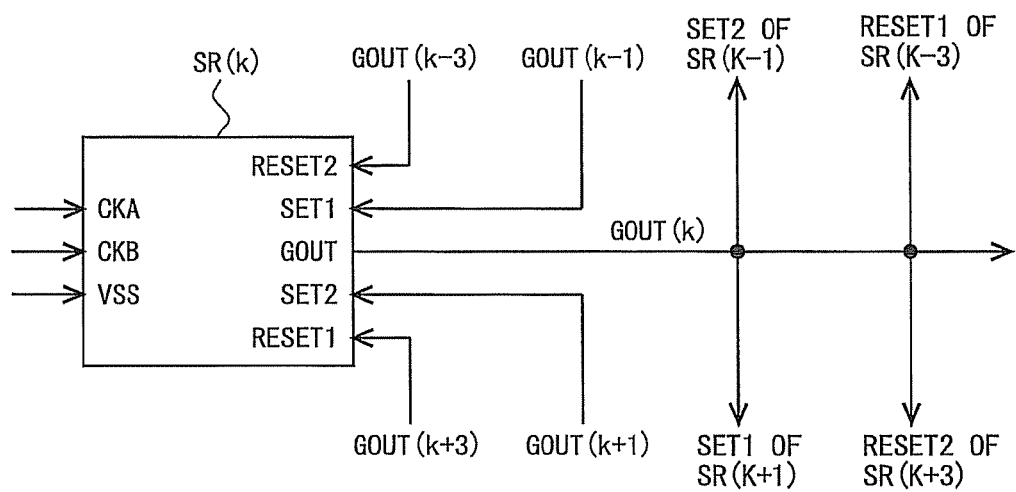
FIG. 4 is a diagram for describing input/output signals of a k-th bistable circuit of a shift register in the first embodiment.

A configuration of the gate driver 40 according to the present embodiment is described below with reference to FIGS. 1, 3, and 4. As shown in FIG. 3, the gate driver 40 is configured by a shift register 410 having n stages. A pixel matrix of n rows×m columns is formed in the display unit 10, and the stages of the shift register 410 are provided so as to have a one-to-one correspondence with the rows of the pixel matrix. In addition, each stage of the shift register 410 is a bistable circuit that is in either one of two states (a first state and a second state) at each time point, and that outputs a signal (state signal) indicating this state as a scanning signal. In this way, the shift register 410 is configured by n bistable circuits SR(1) to SR(n). Note that, in the present embodiment, when a bistable circuit is in the first state, the bistable circuit outputs a state signal of a high level (H level) as a scanning signal, and when a bistable circuit is in the second state, the bistable circuit outputs a state signal of a low level (L level) as a scanning signal. The following description is made by assuming that the shift register 410 is configured by eight bistable circuits SR(1) to SR(8)

Figure 1:
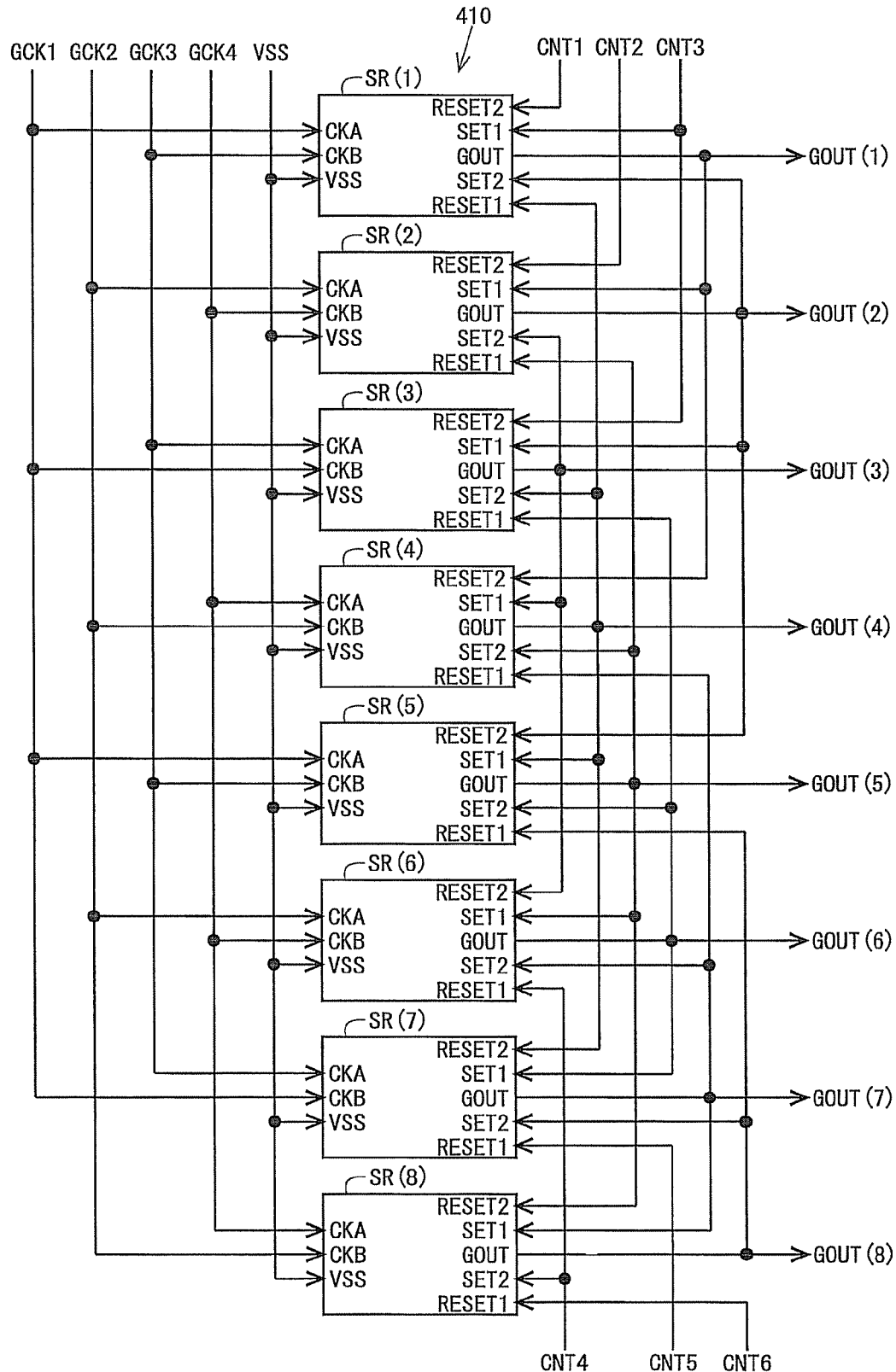
FIG. 1 is a block diagram showing a configuration of a shift register within a gate driver of an active matrix-type liquid crystal display device according to a first embodiment of the present invention.

FIG. 1 is a block diagram showing a configuration of the shift register 410 within the gate driver 40. Moreover, FIG. 4 is a diagram for describing input/output signals of a k-th bistable circuit SR(k) of the shift register 410. As shown in FIG. 1, the shift register 410 is configured by the eight bistable circuits SR(1) to SR(8). Each bistable circuit is provided with input terminals for receiving two-phase clock signals CKA (hereinafter, referred to as a "first clock") and CKB (hereinafter, referred to as a "second clock") respectively, an input terminal for receiving a low-level power source voltage VSS, an input terminal for receiving a first set signal SET1 as a scanning starting signal when a forward scanning is performed, an input terminal for receiving a second set signal SET2 as a scanning starting signal when a backward scanning is performed, an input terminal for receiving a first reset signal RESET1 as a scanning ending signal when a forward scanning is performed, an input terminal for receiving a second reset signal RESET2 as a scanning ending signal when a backward scanning is performed, and an output terminal for outputting a scanning signal GOUT.

Signals provided to input terminals of each stage (each bistable circuit) are described below. Note that as shown in FIG. 1, the low-level power source voltage VSS is commonly provided to all stages SR(1) to SR(8).

The first clock CKA and the second clock CKB are provided as follows (see FIG. 1). In the first stage SR(1), the first gate clock signal GCK1 is provided as the first clock CKA, and the third gate clock signal GCK3 is provided as the second clock CKB. In the second stage SR(2), the second gate clock signal GCK2 is provided as the first clock CKA, and the fourth gate clock signal GCK4 is provided as the second clock CKB. In the third stage SR(3), the third gate clock signal GCK3 is provided as the first clock CKA, and the first gate clock signal GCK1 is provided as the second clock CKB. In the fourth stage SR(4), the fourth gate clock signal GCK4 is provided as the first clock CKA, and the second gate clock signal GCK2 is provided as the second clock CKB. The fifth stage SR(5) to the eighth stage SR(8) have configurations that are similar to those of the first stage SR(1) to the fourth stage SR(4) described above.

The first set signal SET1 and the second set signal SET2 are provided as follows. Focusing attention on the k-th stage SR(k), a pre-stage scanning signal GOUT(k−1) is provided as the first set signal SET1, and a next-stage scanning signal GOUT(k+1) is provided as the second set signal SET2 (see FIG. 4). However, in the first stage SR(1), a third scanning control signal CNT3 is provided as the first set signal SET1, and in the eighth stage (last stage) SR(8), a fourth scanning control signal CNT4 is provided as the second set signal SET2 (see FIG. 1).

The first reset signal RESET1 and the second reset signal RESET2 are provided as follows. Focusing attention on the k-th stage SR(k), a (k+3)-th stage scanning signal GOUT(k+3) is provided as the first reset signal RESET1, and a (k−3)-th stage scanning signal GOUT(k−3) is provided as the second reset signal RESET2 (see FIG. 4). However, in the first stage SR(1), the first scanning control signal CNT1 is provided as the second reset signal RESET2, in the second stage SR(2), the second scanning control signal CNT2 is provided as the second reset signal RESET2, and in the third stage SR(3), the third scanning control signal CNT3 is provided as the second reset signal RESET2. In the sixth stage SR(6), the fourth scanning control signal CNT4 is provided as the first reset signal RESET1, in the seventh stage SR(7), the fifth scanning control signal CNT5 is provided as the first reset signal RESET1, and in the eighth stage SR(8), the sixth scanning control signal CNT6 is provided as the first reset signal RESET1 (see FIG. 1).

A signal outputted from the output terminal of each stage (each bistable circuit) is described next. From the output terminal of the k-th stage SR(k), a scanning signal GOUT(k) for setting a k-th gate bus line GLk to a selected state is outputted. The scanning signal GOUT(k) is provided to the (k−3)-th stage as the first reset signal RESET1, is provided to the (k−1)-th stage as the second set signal SET2, is provided to the (k+1)-th stage as the first set signal SET1, and is provided to the (k+3)-th stage as the second reset signal RESET2 (see FIG. 4).

A first-stage-side control signal is realized by the first scanning control signal CNT1, the second scanning control signal CNT2, and the third scanning control signal CNT3. A last-stage-side control signal is realized by the fourth scanning control signal CNT4, the fifth scanning control signal CNT5, and the sixth scanning control signal CNT6.

1.3 A Configuration of the Bistable Circuit

Figure 5:
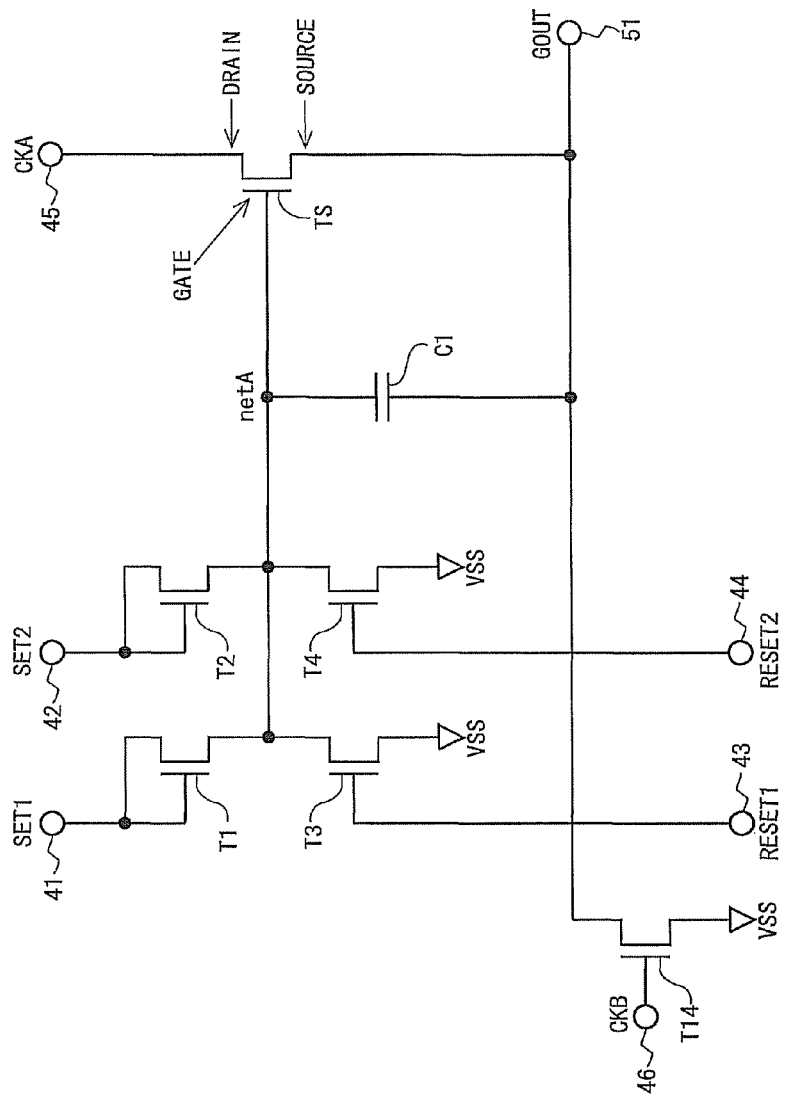
FIG. 5 is a circuit diagram showing a configuration of a bistable circuit included in the shift register in the first embodiment.

FIG. 5 is a circuit diagram showing a configuration of the bistable circuit (a configuration of one stage of the shift register 410) included in the shift register 410 described above. As shown in FIG. 5, this bistable circuit includes six thin-film transistors TS (output-control switching element), T1 (first switching element), T2 (second switching element), T3 (third switching element), T4 (fourth switching element), and T14 (fourteenth switching element), and a capacitor C1. Further, this bistable circuit includes six input terminals 41 to 46 and one output terminal (output node) 51, in addition to the input terminal for the low-level power source voltage VSS. Note that, a reference numeral 41 is attached to an input terminal that receives the first set signal SET1, a reference numeral 42 is attached to an input terminal that receives the second set signal SET2, a reference numeral 43 is attached to an input terminal that receives the first reset signal RESET1, a reference numeral 44 is attached to an input terminal that receives the second reset signal RESET2, a reference numeral 45 is attached to an input terminal that receives the first clock CKA, and a reference numeral 46 is attached to an input terminal that receives the second clock CKB. Connection relationships between constituent elements within this bistable circuit are described below.

A source terminal of the thin-film transistor T1, a source terminal of the thin-film transistor T2, a drain terminal of the thin-film transistor T3, a drain terminal of the thin-film transistor T4, and a gate terminal of the thin-film transistor TS are connected to each other. Note that a region (wiring) in which these terminals are connected to each other is called a "netA" (first node), for convenience.

In the thin-film transistor T1, a gate terminal and a drain terminal are connected to the input terminal 41 (that is, in a diode connection), and the source terminal is connected to the netA. In the thin-film transistor T2, a gate terminal and a drain terminal are connected to the input terminal 42 (that is, in a diode connection), and the source terminal is connected to the netA. In the thin-film transistor T3, a gate terminal is connected to the input terminal 43, the drain terminal is connected to the netA, and a source terminal is connected to the power source voltage VSS. In the thin-film transistor T4, a gate terminal is connected to the input terminal 44, the drain terminal is connected to the netA, and a source terminal is connected to the power source voltage VSS. In the thin-film transistor TS, the gate terminal is connected to the netA, a drain terminal is connected to the input terminal 45, and a source terminal is connected to the output terminal 51. In the thin-film transistor T14, a gate terminal is connected to the input terminal 46, a drain terminal is connected to the output terminal 51, and a source terminal is connected to the power source voltage VSS. In the capacitor C1, one end is connected to the netA, and the other end is connected to the output terminal 51.

Functions of constituent elements in this bistable circuit are described next. The thin-film transistor T1 sets a potential of the netA to a high level, when the first set signal SET1 is at a high level. The thin-film transistor T2 sets a potential of the netA to a high level, when the second set signal SET2 is at a high level. The thin-film transistor T3 sets a potential of the netA to a low level, when the first reset signal RESET1 is at a high level. The thin-film transistor T4 sets a potential of the netA to a low level, when the second reset signal RESET2 is at a high level. The thin-film transistor TS provides a potential of the first clock CKA to the output terminal 51, when a potential of the netA is at a high level. The thin-film transistor T14 sets a potential of the scanning signal GOUT (a potential of the output terminal 51) to a low level, when the second clock CKB is at a high level. The capacitor C1 functions as a compensation capacitance for maintaining a potential of the netA at a high level during a period when a gate bus line connected to this bistable circuit is in a selected state.

Note that, in the present embodiment, a first first-node charging unit is realized by the thin-film transistor T1, and a second first-node charging unit is realized by the thin-film transistor T2. Further, a first first-node discharging unit is realized by the thin-film transistor T3, and a second second-node discharging unit is realized by the thin-film transistor T4.

1.4. An Operation of the Shift Register

An operation of the shift register 410 according to the present embodiment is described next. Note that, the operation is different depending on a forward scanning and a backward scanning, based on a timing of occurrence of pulses of the first to sixth scanning control signals CNT1 to CNT6 that are provided from the display control circuit 20.

<1.4.1 An Operation of Each Stage (Bistable Circuit)>

Figure 6:
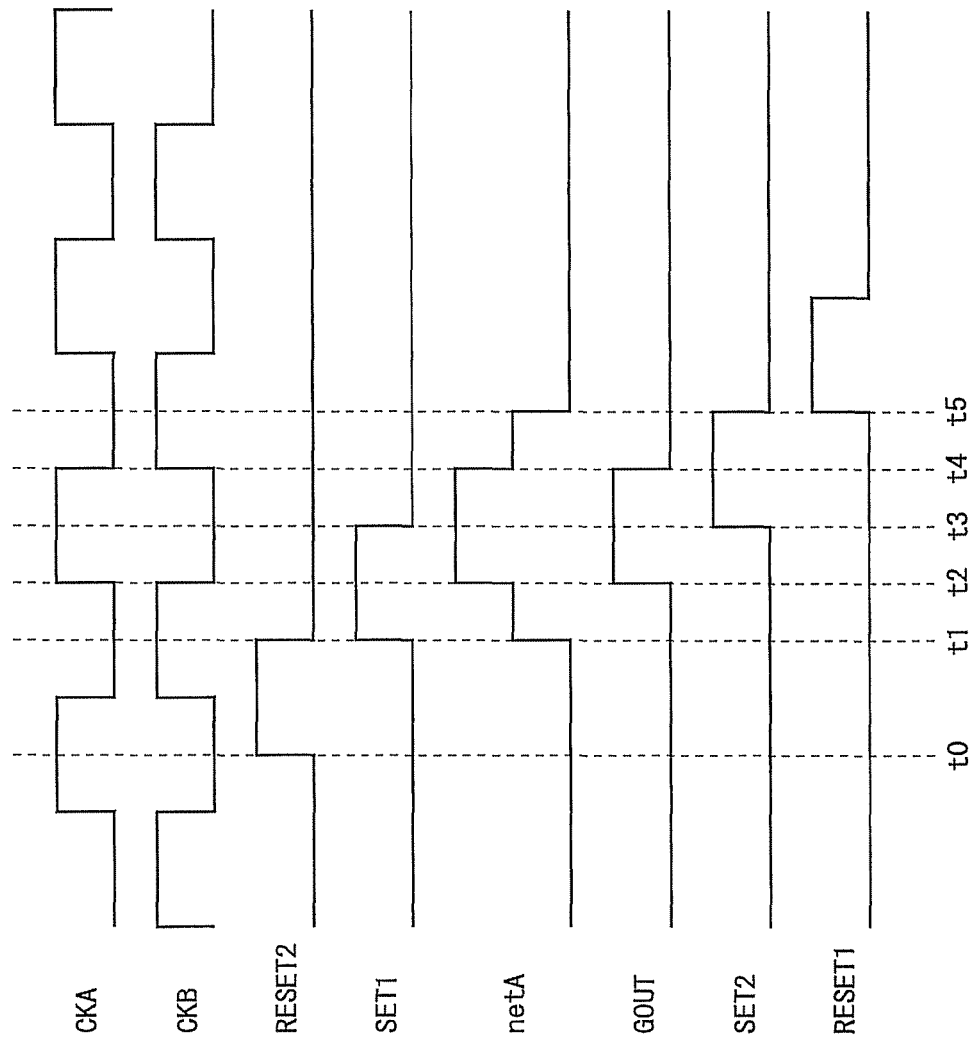
FIG. 6 is a timing chart for describing an operation of each stage of the shift register when a forward scanning is performed in the first embodiment.
Figure 7:
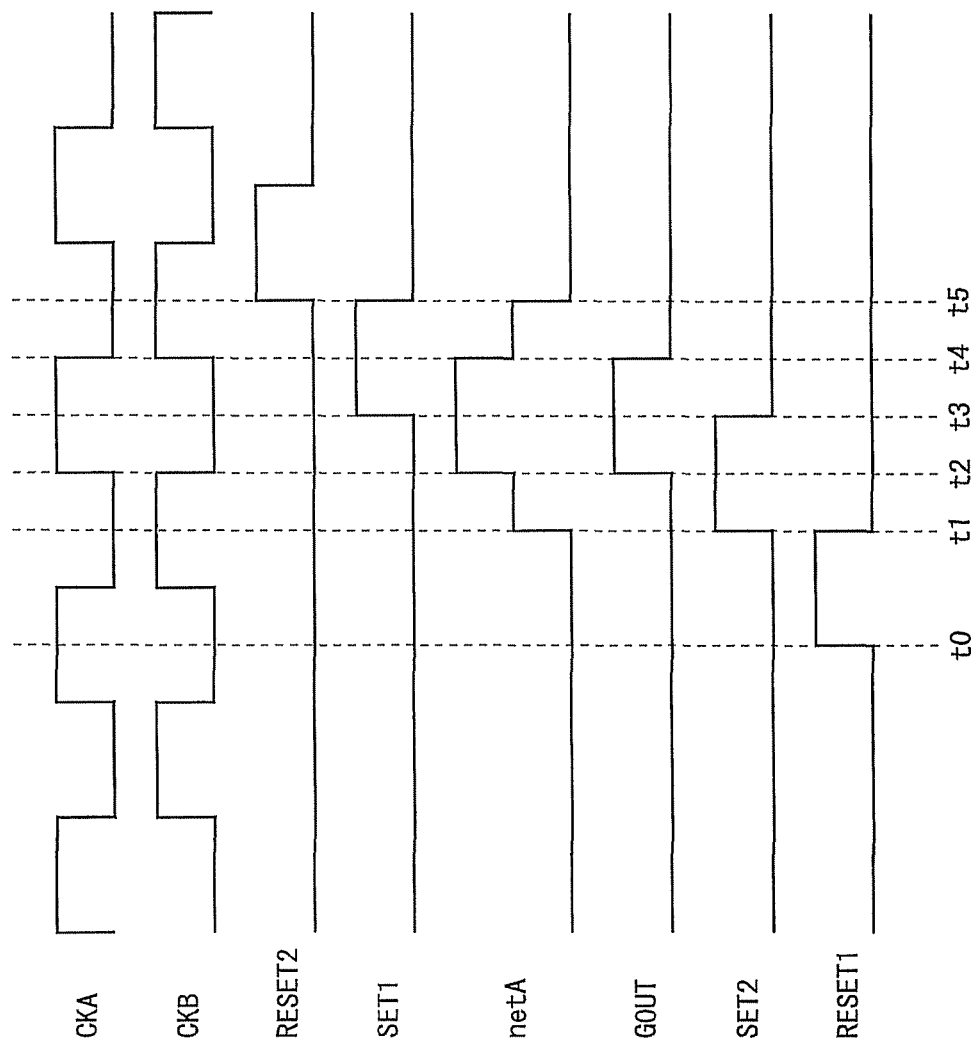
FIG. 7 is a timing chart for describing an operation of each stage of the shift register when a backward scanning is performed in the first embodiment.

An operation of each stage (bistable circuit) of the shift register 410 is described with reference to FIGS. 5 to 7. Note that FIG. 6 is a timing chart when a forward scanning is performed, and FIG. 7 is a timing chart when a backward scanning is performed. In the following description, it is assumed that a period from a time point t2 to a time point t4 in FIGS. 6 and 7 is a period (selected period) during which a gate bus line connected to the output terminal 51 of the bistable circuit is to be placed in a selected state. Note that, a period from the time point t2 to the time point t3 is a period for preliminary charge (precharge) to a pixel capacitance, and a period from the time point t3 to the time point t4 is a period for primary charge (main charge) to the pixel capacitance <1.4.1.1 An Operation when a Forward Scanning is Performed>

An operation of the bistable circuit when performing a forward scanning is described. As shown in FIG. 6, during an operation of the liquid crystal display device, the first clock CKA is provided to the input terminal 45, and the second clock CKB is provided to the input terminal 46. In this way, in the present embodiment, two-phase clock signals of which phases are shifted by 180 degrees from each other are provided to the bistable circuit.

During a period before a time point to, the potential of the netA and the potential of the scanning signal GOUT (the potential of the output terminal 51) are at a low level. When reaching the time point t0, a pulse of the second reset signal RESET2 is provided to the input terminal 44. Accordingly, the thin-film transistor T4 becomes in an on state, and the potential of the netA is maintained at the low level. When reaching the time point t1, a pulse of the first set signal SET1 is provided to the input terminal 41. Because the thin-film transistor T1 is in a diode connection as shown in FIG. 5, the thin-film transistor T1 becomes in an on state by the pulse of the first set signal SET1, and the capacitor C1 is charged. Accordingly, the potential of the netA changes from the low level to a high level, and the thin-film transistor TS becomes in an on state. During a period from the time point t1 to the time point t2, the first clock CKA is at a low level. Therefore, during this period, the scanning signal GOUT is maintained at a low level.

When reaching the time point t2, the first clock CKA changes from the low level to the high level. At this time, because the thin-film transistor TS is in the on state, the potential of the output terminal 51 increases with an increase in the potential of the input terminal 45. In this case, because the capacitor C1 is provided between the netA and the output terminal 51 as shown in FIG. 5, the potential of the netA also increases (the netA is bootstrapped) with the increase in the potential of the output terminal 51. As a result, a large voltage is applied to the thin-film transistor TS, and the potential of the scanning signal GOUT increases to the high-level potential of the first clock CKA. Consequently, a gate bus line connected to the output terminal 51 of this bistable circuit becomes in a selected state.

When reaching the time point t3, a pulse of the second set signal SET2 is provided to the input terminal 42. Because the thin-film transistor T2 is in the diode connection as shown in FIG. 5, the thin-film transistor T2 becomes in an on state by the pulse of the second set signal SET2. However, because the potential of the netA is already high due to the bootstrap, the potential of the netA does not vary due to the thin-film transistor T2 becoming in the on state. In addition, because the potential of the first clock CKA and the potential of the second clock CKB do not change at the time point t3, the netA and the scanning signal GOUT maintain the potentials at the time point t2 to the time point t3.

When reaching the time point t4, the first clock CKA changes from the high level to the low level. Accordingly, the potential of the output terminal 51 decreases with the decrease in the potential of the input terminal 45, and the potential of the netA also decreases via the capacitor C1. Note that, because the potential of the netA decreases by only about a decrease of the potential of the output terminal 51, the potential of the netA does not decrease to a low level and is maintained at a high level. Further, at the time point t4, the second clock CKB changes from the low level to the high level. Accordingly, the thin-film transistor T14 becomes in an on state, and the potential of the output terminal 51, that is, the potential of the scanning signal GOUT, becomes at the low level.

When reaching a time point t5, a pulse of the first reset signal RESET1 is provided to the input terminal 43. Accordingly, the thin-film transistor T3 becomes in an on state, and the potential of the netA changes from the high level to the low level.

During the period from the time point t1 to the time point t5, because the first reset signal RESET1 and the second reset signal RESET2 are at the low level, the thin-film transistors T3 and T4 are maintained in an off state. Therefore, the potential of the netA does not decrease to the low level during this period. During the period from the time point t2 to the time point t4, because the second clock CKB is at the low level, the thin-film transistors T14 is maintained in an off state. Therefore, the potential of the scanning signal GOUT does not decrease to the low level during this period.

As described above, when the forward scanning is performed, the first set signal SET1 functions as a signal for increasing a potential of the netA from a low level to a high level to generate an active scanning signal GOUT, and the first reset signal RESET1 functions as a signal for decreasing a high-level potential of the netA to a low level. By the first clock CKA becoming at the high level during the period when the potential of the netA is at the high level, the active scanning signal GOUT is outputted from the bistable circuit.

<1.4.1.2 An Operation when a Backward Scanning is Performed>

An operation of the bistable circuit when performing a backward scanning is described. As shown in FIG. 7, during an operation of the liquid crystal display device, the first clock CKA is provided to the input terminal 45, and the second clock CKB is provided to the input terminal 46, in a similar manner to that of the forward scanning.

During a period before a time point to, the potential of the netA and the potential of the scanning signal GOUT (the potential of the output terminal 51) are at a low level. When reaching the time point to, a pulse of the first reset signal RESET1 is provided to the input terminal 43. Accordingly, the thin-film transistor T3 becomes in an on state, and the potential of the netA is maintained at the low level. When reaching the time point t1, a pulse of the second set signal SET2 is provided to the input terminal 42. Because the thin-film transistor T2 is in a diode connection as shown in FIG. 5, the thin-film transistor T2 becomes in an on state by the pulse of the second set signal SET2, and the capacitor C1 is charged. Accordingly, the potential of the netA changes from the low level to a high level, and the thin-film transistor TS becomes in an on state. During the period from the time point t1 to the time point t2, the first clock CKA is at the low level. Therefore, during this period, the scanning signal GOUT is maintained at the low level.

When reaching the time point t2, the first clock CKA changes from the low level to the high level. At this time, because the thin-film transistor TS is in the on state, the potential of the output terminal 51 increases with an increase in the potential of the input terminal 45. In this case, because the capacitor C1 is provided between the netA and the output terminal 51 as shown in FIG. 5, the potential of the netA also increases (the netA is bootstrapped) with the increase in the potential of the output terminal 51. As a result, a large voltage is applied to the thin-film transistor TS, and the potential of the scanning signal GOUT increases to a high-level potential of the first clock CKA. Consequently, a gate bus line connected to the output terminal 51 of this bistable circuit becomes in a selected state.

When reaching the time point t3, a pulse of the first set signal SET1 is provided to the input terminal 41. Because the thin-film transistor T1 is in the diode connection as shown in FIG. 5, the thin-film transistor T1 becomes in an on state by the pulse of the first set signal SET1. However, because the potential of the netA is already high due to the bootstrap, the potential of the netA does not vary due to the thin-film transistor T1 becoming in the on state. Further, because the potential of the first clock CKA and the potential of the second clock CKB do not change at the time point t3, the netA and the scanning signal GOUT maintain the potentials at the time point t2 to the time point t3.

When reaching the time point t4, the first clock CKA changes from the high level to the low level. Accordingly, the potential of the output terminal 51 decreases with the decrease in the potential of the input terminal 45, and the potential of the netA also decreases via the capacitor C1. Note that, because the potential of the netA decreases by only about a decrease of the potential of the output terminal 51, the potential of the netA does not decrease to the low level and is maintained at the high level. Further, at the time point t4, the second clock CKB changes from the low level to the high level. Accordingly, the thin-film transistor T14 becomes in an on state, and the potential of the output terminal 51, that is, the potential of the scanning signal GOUT, becomes at the low level.

When reaching a time point t5, a pulse of the second reset signal RESET2 is provided to the input terminal 44. Accordingly, the thin-film transistor T4 becomes in an on state, and the potential of the netA changes from the high level to the low level.

During the period from the time point t1 to the time point t5, the potential of the netA does not decrease to the low level, and during the period from the time point t2 to the time point t4, the potential of the scanning signal GOUT does not decrease to the low level, in a similar manner to that of the forward scanning.

As described above, when the backward scanning is performed, the second set signal SET2 functions as a signal for increasing a potential of the netA from a low level to a high level to generate an active scanning signal GOUT; and the second reset signal RESET2 functions as a signal for decreasing a high-level potential of the netA to a low level. By the first clock CKA becoming at the high level during the period when the potential of the netA is at the high level, the active scanning signal GOUT is outputted from the bistable circuit.

<1.4.2 An Overall Operation of the Shift Register>

Figure 8:
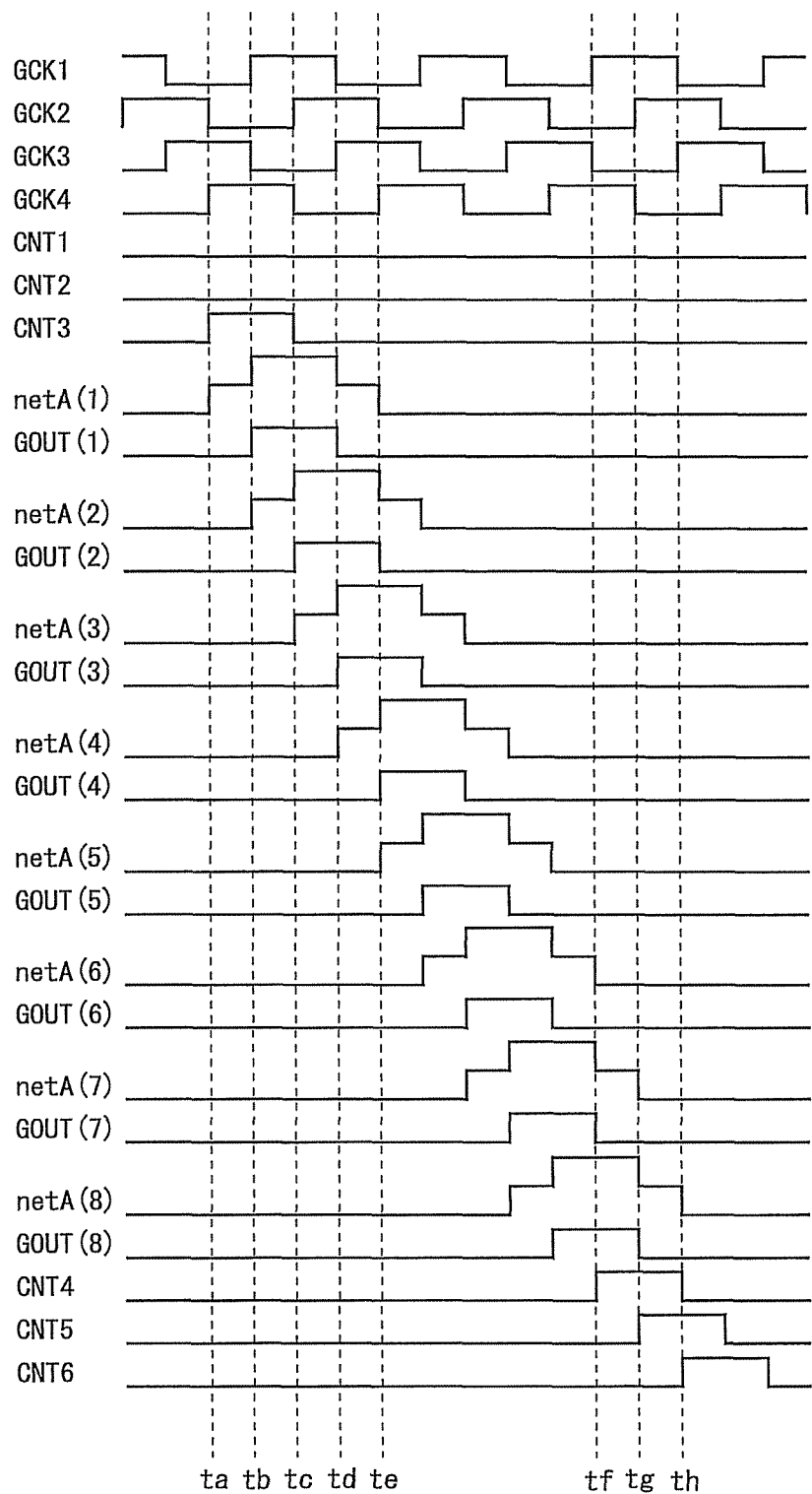
FIG. 8 is a timing chart for describing an overall operation of the shift register when the forward scanning is performed in the first embodiment.
Figure 9:
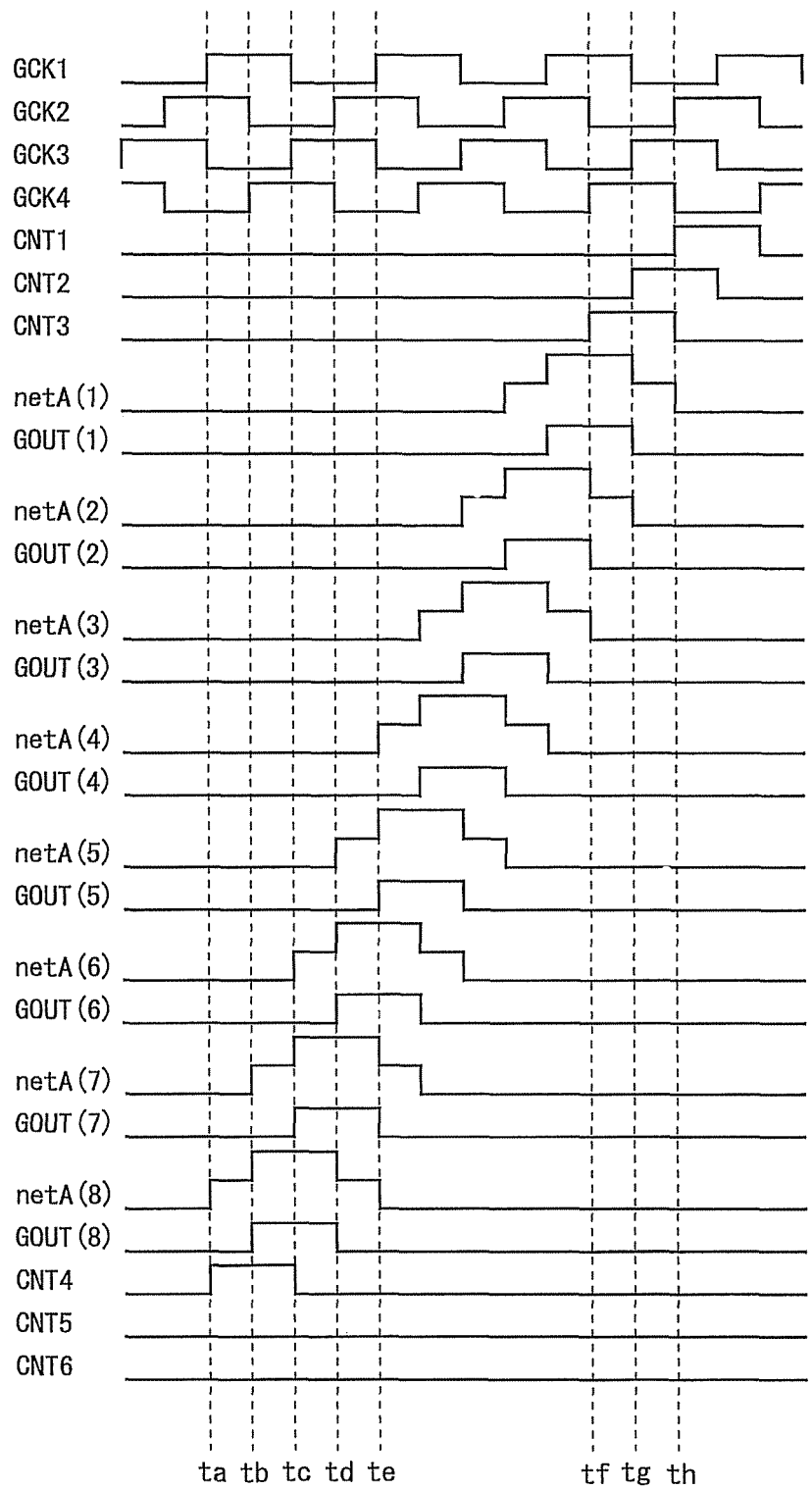
FIG. 9 is a timing chart for describing an overall operation of the shift register when the backward scanning is performed in the first embodiment.

An overall operation of the shift register 410 based on the operation of each stage (bistable circuit) described above is described next with reference to FIGS. 1, 5, 8, and 9. FIG. 8 is a timing chart when the forward scanning is performed, and FIG. 9 is a timing chart when the backward scanning is performed.

<1.4.2.1> An Operation when the Forward Scanning is Performed>

An overall operation of the shift register 410 when performing the forward scanning is described. During an operation of the liquid crystal display device, as shown in FIG. 8, the first to fourth gate clock signals GCK1 to GCK4 are provided to the shift register 410. Based on the first gate clock signal GCK1, a phase of the second gate clock signal GCK2 is late by 90 degrees, a phase of the third gate clock signal GCK3 is late by 180 degrees, and a phase of the fourth gate clock signal GCK4 is late by 270 degrees.

During a period before a time point ta, a potential of the netA is at a low level in all stages, and a potential of the scanning signal GOUT outputted from all stages is at a low level. When reaching the time point ta, a pulse of the third scanning control signal CNT3 is provided to this shift register 410. As shown in FIG. 1, the third scanning control signal CNT3 is provided to the first stage SR(1) as the first set signal SET1, and is provided to the third stage SR(3) as the second reset signal RESET2. Accordingly, the potential of the netA of the first stage SR(1) changes from the low level to a high level. The potential of the netA of the third stage SR(3) is maintained at the low level.

When reaching a time point tb, the first gate clock signal GCK1 changes from the low level to a high level. At this time, because the potential of the input terminal 45 (see FIG. 5) changes from the low level to the high level in the first stage SR(1), the potential of the netA of the first stage SR(1) further increases. As a result, the scanning signal GOUT(1) outputted from the first stage SR(1) becomes at a high level. As shown in FIG. 1, the scanning signal GOUT(1) outputted from the first stage SR(1) is provided to the second stage SR(2) as the first set signal SET1, and is provided to the fourth stage SR(4) as the second reset signal RESET2. Accordingly, at the time point tb, the potential of the netA, of the second stage SR(2) is set to the high level, and the potential of the netA of the fourth stage SR(4) is maintained at the low level.

When reaching a time point tc, the second gate clock signal GCK2 changes from the low level to the high level. At this time, because the potential of the input terminal 45 changes from the low level to the high level in the second stage SR(2), the potential of the netA of the second stage SR(2) further increases. As a result, the scanning signal GOUT(2) outputted from the second stage SR(2) becomes at a high level. The scanning signal GOUT(2) outputted from the second stage SR(2) is provided to the first stage SR(1) as the second set signal SET2. In the first stage SR(1), because the potential of the netA is already high due to the bootstrap, the potential of the netA does not vary due to the scanning signal GOUT(2). Further, at the time point tc, the potentials of the first gate clock signal GCK1 and the third gate clock signal GCK3 that are provided to the first stage SR(1) do not change. Therefore, in the first stage SR(1), for the potential of the netA and the potential of the scanning signal GOUT, the potentials at the time point tb to the time point tc are maintained. The scanning signal GOUT(2) outputted from the second stage SR(2) is provided to the third stage SR(3) as the first set signal SET1, and is also provided to the fifth stage SR(5) as the second reset signal RESET2. Accordingly, at the time point tc, the potential of the netA of the third stage SR(3) is set to the high level, and the potential of the netA of the fifth stage SR(5) is maintained at the low level.

When reaching a time point td, the first gate clock signal GCK1 changes from the high level to the low level. Accordingly, the potential of the netA of the first stage SR(1) decreases. At the time point td, the third gate clock signal GCK3 changes from the low level to the high level. At this time, because the potential of the input terminal 46 (see FIG. 5) changes from the low level to the high level in the first stage SR(1), the scanning signal GOUT(1) outputted from the first stage SR(1) becomes at the low level. The third gate clock signal GCK3 is provided to the third stage SR(3) as the first clock CKA. Accordingly, by the third gate clock signal GCK3 changing from the low level to the high level, the potential of the netA of the third stage SR(3) further increases, and the scanning signal GOUT(3) outputted from the third stage SR(3) becomes at a high level. The scanning signal GOUT(3) outputted from the third stage SR(3) is provided to the second stage SR(2) as the second set signal SET2, is provided to the fourth stage SR(4) as the first set signal SET1, and is provided to the sixth stage SR(6) as the second reset signal RESET2. In the second stage SR(2), for the potential of the netA and the potential of the scanning signal GOUT, the potentials at the time point tc to the time point td are maintained, in a similar manner to that of the first stage SR(1) at the time point tc. In addition, the potential of the netA of the fourth stage SR(4) is set to the high level, and the potential of the netA of the sixth stage SR(6) is maintained at the low level.

When reaching a time point te, the second gate clock signal GCK2 changes from the high level to the low level. Accordingly, the potential of the netA of the second stage SR(2) decreases. Moreover, at the time point te, the fourth gate clock signal GCK4 changes from the low level to the high level. At this time, because the potential of the input terminal 46 changes from the low level to the high level in the second stage SR(2), the scanning signal GOUT(2) outputted from the second stage SR(2) becomes at the low level. In addition, the fourth gate clock signal GCK4 is provided to the fourth stage SR(4) as the first clock CKA. Accordingly, by the fourth gate clock signal GCK4 changing from the low level to the high level, the potential of the netA of the fourth stage SR(4) further increases, and the scanning signal GOUT(4) outputted from the fourth stage SR(4) becomes at a high level. The scanning signal GOUT(4) outputted from the fourth stage SR(4) is provided to the first stage SR(1) as the first reset signal RESET1, is provided to the third stage SR(3) as the second set signal SET2, is provided to the fifth stage SR(5) as the first set signal SET1, and is provided to seventh stage as the second reset signal RESET2. Accordingly, the potential of the netA of the first stage SR(1) changes from the high level to the low level, the potential of the netA of the third stage SR(3) is maintained at the high level, the potential of the netA of the fifth stage SR(5) changes from the low level to the high level, and the potential of the netA of the seventh stage SR(7) is maintained at the low level.

In a manner as described above, the scanning signals GOUT(1) to GOUT(8) are sequentially set to a high level during each predetermined period from the first stage SR(1) to the eighth stage SR(8). When reaching a time point tf, a pulse of the fourth scanning control signal CNT4 is provided to this shift register 410. As shown in FIG. 1, the fourth scanning control signal CNT4 is provided to the sixth stage SR(6) as the first reset signal RESET1, and is provided to the eighth stage SR(8) as the second set signal SET2. Accordingly, the potential of the netA of the sixth stage SR(6) changes from the high level to the low level, and the potential of the netA of the eighth stage SR(8) is maintained at the high level.

When reaching a time point tg, a pulse of the fifth scanning control signal CNT5 is provided to this shift register 410. As shown in FIG. 1, the fifth scanning control signal CNT5 is provided to the seventh stage SR(7) as the first reset signal RESET1. Accordingly, the potential of the netA of the seventh stage SR(7) changes from the high level to the low level.

When reaching a time point th, a pulse of the sixth scanning control signal CNT6 is provided to this shift register 410. As shown in FIG. 1, the sixth scanning control signal CNT6 is provided to the eighth stage SR(8) as the first reset signal RESET1. Accordingly, the potential of the netA of the eighth stage SR(8) changes from the high level to the low level.

As described above, the forward scanning of the gate bus lines GL1 to GL8 is performed, by using the third scanning control signal CNT3 as a signal for starting a scanning of the gate bus lines GL1 to GL8 that are included in this liquid crystal display device, and by using the fourth to sixths scanning control signals CNT4 to CNT6 as signals for ending the scanning.

<1.4.2.2 An Operation when a Backward Scanning is Performed>

An overall operation of the shift register 410 when performing a backward scanning is described next. As shown in FIG. 9, during an operation of the liquid crystal display device, the first to fourth gate clock signals GCK1 to GCK4 are provided to the shift register 410. Based on the first gate clock signal GCK1, a phase of the second gate clock signal GCK2 is advanced by 90 degrees, a phase of the third gate clock signal GCK3 is advanced by 180 degrees, and a phase of the fourth gate clock signal GCK4 is advanced by 270 degrees. In the case of the forward scanning, clock pulses of four-phase clock signals are provided to the shift register 410, in the order of "the first gate clock signal GCK1, the second gate clock signal GCK2, the third gate clock signal GCK3, the fourth gate clock signal GCK4". However, in the case of the backward scanning, clock pulses of the four-phase clock signals are provided to the bistable circuit, in the order of "the fourth gate clock signal GCK4, the third gate clock signal GCK3, the second gate clock signal GCK2, the first gate clock signal GCK1". The display control circuit 20 switches the orders of the occurrence of the clock pulses.

During a period before the time point ta, a potential of the netA is at a low level in all stages, and a potential of the scanning signal GOUT outputted from all stages is at a low level. When reaching the time point ta, a pulse of the fourth scanning control signal CNT4 is provided to this shift register 410. As shown in FIG. 1, the fourth scanning control signal CNT4 is provided to the eighth stage SR(8) as the second set signal SET2, and is provided to the sixth stage SR(6) as the first reset signal RESET1. Accordingly, the potential of the netA of the eighth stage SR(8) changes from the low level to a high level. The potential of the netA of the sixth stage SR(6) is maintained at the low level.

When reaching a time point tb, the fourth gate clock signal GCK4 changes from the low level to a high level. At this time, because the potential of the input terminal 45 changes from the low level to the high level in the eighth stage SR(8), the potential of the netA of the eighth stage SR(8) further increases. As a result, the scanning signal GOUT(8) outputted from the eighth stage SR(8) becomes at a high level. As shown in FIG. 1, the scanning signal GOUT(8) outputted from the eighth stage SR(8) is provided to the seventh stage SR(7) as the second set signal SET2, and is provided to the fifth stage SR(5) as the first reset signal RESET1. Accordingly, at the time point tb, the potential of the netA of the seventh stage SR(7) is set to a high level, and the potential of the netA of the fifth stage SR(5) is maintained at the low level.

When reaching a time point tc, the third gate clock signal GCK3 changes from the low level to the high level. At this time, because the potential of the input terminal 45 changes from the low level to the high level in the seventh stage SR(7), the potential of the netA of the seventh stage SR(7) further increases. As a result, the scanning signal GOUT(7) outputted from the seventh stage SR(7) becomes at the high level. The scanning signal GOUT(7) outputted from the seventh stage SR(7) is provided to the eighth stage SR(8) as the first set signal SET1. In the eighth stage SR(8), because the potential of the netA is already high due to the bootstrap, the potential of the netA does not vary due to the scanning signal GOUT(7). At the time point tc, the potentials of the second gate clock signal GCK2 and the fourth gate clock signal GCK4 that are provided to the eighth stage SR(8) do not change. Therefore, in the eighth stage SR(8), for the potential of the netA and, the potential of the scanning signal GOUT, the potentials at the time point tb to the time point tc are maintained. The scanning signal GOUT(7) outputted from the seventh stage SR(7) is provided to the sixth stage SR(6) as the second set signal SET2, and is also provided to the fourth stage SR(4) as the first reset signal RESET1. Accordingly, at the time point tc, the potential of the netA of the sixth stage SR(6) is set to a high level, and the potential of the netA of the fourth stage SR(4) is maintained at the low level.

When reaching a time point td, the fourth gate clock signal GCK4 changes from the high level to a low level. Accordingly, the potential of the netA of the eighth stage SR(8) decreases. Further, at the time point td, the second gate clock signal GCK2 changes from the low level to the high level. At this time, because the potential of the input terminal 46 changes from the low level to the high level in the eighth stage SR(8), the scanning signal GOUT(8) outputted from the eighth stage SR(8) becomes at the low level. Further, the second gate clock signal GCK2 is provided to the sixth stage SR(6) as the first clock CKA. Accordingly, by the second gate clock signal GCK2 changing from the low level to the high level, the potential of the netA of the sixth stage SR(6) further increases, and the scanning signal GOUT(6) outputted from the sixth stage SR(6) becomes at a high level. The scanning signal GOUT(6) outputted from the sixth stage SR(6) is provided to the seventh stage SR(7) as the first set signal SET1, is provided to the fifth stage SR(5) as the second set signal SET2, and is provided to the third stage SR(3) as the first reset signal RESET1. In the seventh stage SR(7), for the potential of the netA and the potential of the scanning signal GOUT, the potentials at the time point tc to the time point td are maintained, in a similar manner to that of the eighth stage SR(8) at the time point tc. In the fifth stage SR(5), the potential of the netA is set to a high level, and the potential of the netA of the third stage SR(3) is maintained at the low level.

When reaching a time point te, the third gate clock signal GCK3 changes from the high level to the low level. Accordingly, the potential of the netA of the seventh stage SR(7) decreases. Further, at the time point te, the first gate clock signal GCK1 changes from the low level to the high level. At this time, because the potential of the input terminal 46 changes from the low level to the high level in the seventh stage SR(7), the scanning signal GOUT(7) outputted from the seventh stage SR(7) becomes at a low level. The first gate clock signal GCK1 is provided to the fifth stage SR(5) as the first clock CKA. Accordingly, by the first gate clock signal GCK1 changing from the low level to the high level, the potential of the netA of the fifth stage SR(5) further increases, and the scanning signal GOUT(5) outputted from the fifth stage SR(5) becomes at a high level. The scanning signal GOUT(5) outputted from the fifth stage SR(5) is provided to the eighth stage SR(8) as the second reset signal RESET2, is provided to the sixth stage SR(6) as the first set signal SET1, is provided to the fourth stage SR(4) as the second set signal SET2, and is provided to the second stage SR(2) as the first reset signal RESET1. Accordingly, the potential of the netA of the eighth stage SR(8) changes from the high level to the low level, the potential of the netA of the sixth stage SR(6) is maintained at the high level, the potential of the netA of the fourth stage SR(4) changes from the low level to a high level, and the potential of the netA of the second stage SR(2) is maintained at the low level.

In a manner as described above, the scanning signals GOUT(8) to GOUT(1) are sequentially set to a high level during each predetermined period from the eighth stage SR(8) to the first stage SR(1). Then, when reaching a time point tf, a pulse of the third scanning control signal CNT3 is provided to this shift register 410. As shown in FIG. 1, the third scanning control signal CNT3 is provided to the third stage SR(3) as the second reset signal RESET2, and is provided to the first stage SR(1) as the first set signal SET1. Accordingly, the potential of the netA of the third stage SR(3) changes from the high level to the low level, and the potential of the netA of the first stage SR(1) is maintained at the high level.

When reaching a time point tg, a pulse of the second scanning control signal CNT2 is provided to this shift register 410. As shown in FIG. 1, the second scanning control signal CNT2 is provided to the second stage SR(2) as the second reset signal RESET2. Accordingly, the potential of the netA of the second stage SR(2) changes from the high level to the low level.

When reaching a time point th, a pulse of the first scanning control signal CNT1 is provided to this shift register 410. As shown in FIG. 1, the first scanning control signal CNT1 is provided to the first stage SR(1) as the second reset signal RESET2. Accordingly, the potential of the netA of the first stage SR(1) changes from the high level to the low level.

As described above, the backward scanning of the gate bus lines GL1 to GL8 is performed, by using the fourth scanning control signal CNT4 as a signal for starting a scanning of the gate bus lines GL1 to GL8 that are included in this liquid crystal display device, and by using the first to third scanning control signals CNT1 to CNT3 as signals for ending the scanning.

1.5 Effects

According to the present embodiment, to each stage SR(k) of the shift register 410, the scanning signal GOUT(k−3) outputted from a stage SR(k−3) which is a third stage before a stage concerned is provided, as the second reset signal RESET2, the scanning signal GOUT(k−1) outputted from a pre-stage SR(k−1) is provided, as the first set signal SET1, the scanning signal GOUT(k+1) outputted from a next stage SR(k+1) is provided, as the second set signal SET2, and the scanning signal GOUT(k+3) outputted from a stage SR(k+3) which is a third stage after a stage concerned is provided, as the first reset signal RESET1. The third scanning control signal CNT3 is provided to the first stage SR(1) as the first set signal SET1, and the fourth scanning control signal CNT4 is provided to the eighth stage (the last stage) SR(8) as the second set signal SET2. Therefore, when the pulse of the third scanning control signal CNT3 is provided to the shift register 410 to start a scanning of the gate bus lines GL1 to GL8, the pulse of the first set signal SET1 is provided to each stage in the order of "the first stage, the second stage, . . . , the seventh stage, the eighth stage", and the forward scanning of the gate bus lines GL1 to GL8 is performed. On the other hand, when the pulse of the fourth scanning control signal CNT4 is provided to the shift register 410 to start a scanning of the gate bus lines GL1 to GL8, the pulse of the second set signal SET2 is provided to each stage in the order of "the eighth stage, the seventh stage, . . . , the second stage, the first stage", and the backward scanning of the gate bus lines GL1 to GL8 is performed. Here, in the present embodiment, scanning orders of the gate bus lines GL1 to GL8 can be switched, by configuring such that each stage of the shift register 410 receives two set signals SET1, SET2 and two reset signals RESET1, RESET2. As described above, according to the present embodiment, configurations (for example, "a configuration for changing over a switch by a select signal", "a drive circuit and a signal wiring for the select signal") that are conventionally necessary to switch between scanning orders of the gate bus line become unnecessary. Therefore, in realizing a shift register that can switch between scanning orders of the gate bus lines, it becomes possible to suppress an increase in a circuit area, an increase in current consumption, and a cost increase. Further, because a switch for changing over between scanning orders becomes unnecessary, occurrence of an erroneous operation attributable to a shift of a threshold voltage of a switch (transistor) at a high-temperature aging time is suppressed.

Further, in the present embodiment, odd-order stages and even-order stages of the shift register 410 operate based on different clock signals. Therefore, as shown in FIGS. 8 and 9, a period in which plural gate bus lines are being simultaneously selected can be provided. In this case, because a phase of a clock signal for operating odd-order stages of the shift register 410 and a phase of a clock signal for operating even-order stages of the shift register 410 are shifted by 90 degrees from each other, precharge to a pixel capacitance is performed during a former half period of the period when each gate bus line is being selected, and main charge to a pixel capacitance is performed during a latter half period. Thus, a sufficient charge time is secured, and lowering of the display quality attributable to a shortage of charge to a pixel capacitance is suppressed. Further, it becomes possible to reduce a gate voltage (a voltage to set the thin-film transistor 11 within a pixel formation portion to an on state), to reduce a size of the thin-film transistor 11, and to reduce current consumption.

1.6 Modifications

In the first embodiment, although the capacitor C1 is provided between the netA and the output terminal 51, the present invention is not limited to this. This capacitor C1 is provided to stabilize a waveform of the scanning signal GOUT, and the configuration may be such that the capacitor C1 is not provided. In the first embodiment, although the thin-film transistor T14 that is on/off controlled by the second clock CKB is provided, the present invention is not limited to this. The thin-film transistor T14 is also provided to stabilize a waveform of the scanning signal GOUT, and the configuration may be such that the thin-film transistor T14 is not provided.

Further, the configuration may be such that any one of the first stage SR(1) to the third stage SR(3) includes a thin-film transistor (fifteenth switching element) in which a control signal that is inputted as the second reset signal RESET2 is provided to a gate terminal, a drain terminal is connected to the output terminal 51, and a source terminal is connected to the power source voltage VSS, and that any one of the sixth stage SR(6) to the eighth stage SR(8) includes a thin-film transistor (sixteenth switching element) in which a control signal that is inputted as the first reset signal RESET1 is provided to a gate terminal, a drain terminal is connected to the output terminal 51, and a source terminal is connected to the power source voltage VSS.

Furthermore, focusing attention on the k-th SR(k), the configuration may be such that a thin-film transistor (seventeenth switching element) is provided in which a scanning signal GOUT(k+2) or GOUT(k+3) outputted from a stage SR(k+2) which is a second stage after a stage concerned or from a stage SR(k+3) which is a third stage after a stage concerned is provided to a gate terminal, a drain terminal is connected to the output terminal 51, and a source terminal is connected to the power source voltage VSS, and a thin-film transistor (eighteenth switching element) is provided in which a scanning signal GOUT(k−2) or GOUT(k−3) outputted from a stage SR(k−2) which is a second stage before a stage concerned or from a stage SR(k−3) which is a third stage before a stage concerned is provided to a gate terminal, a drain terminal is connected to the output terminal 51, and a source terminal is connected to the power source voltage VSS. Thus, a potential of the scanning signal GOUT(k) can be more securely decreased to a low level.

2. Second Embodiment

2.1 A Configuration of a Shift Register

Figure 10:
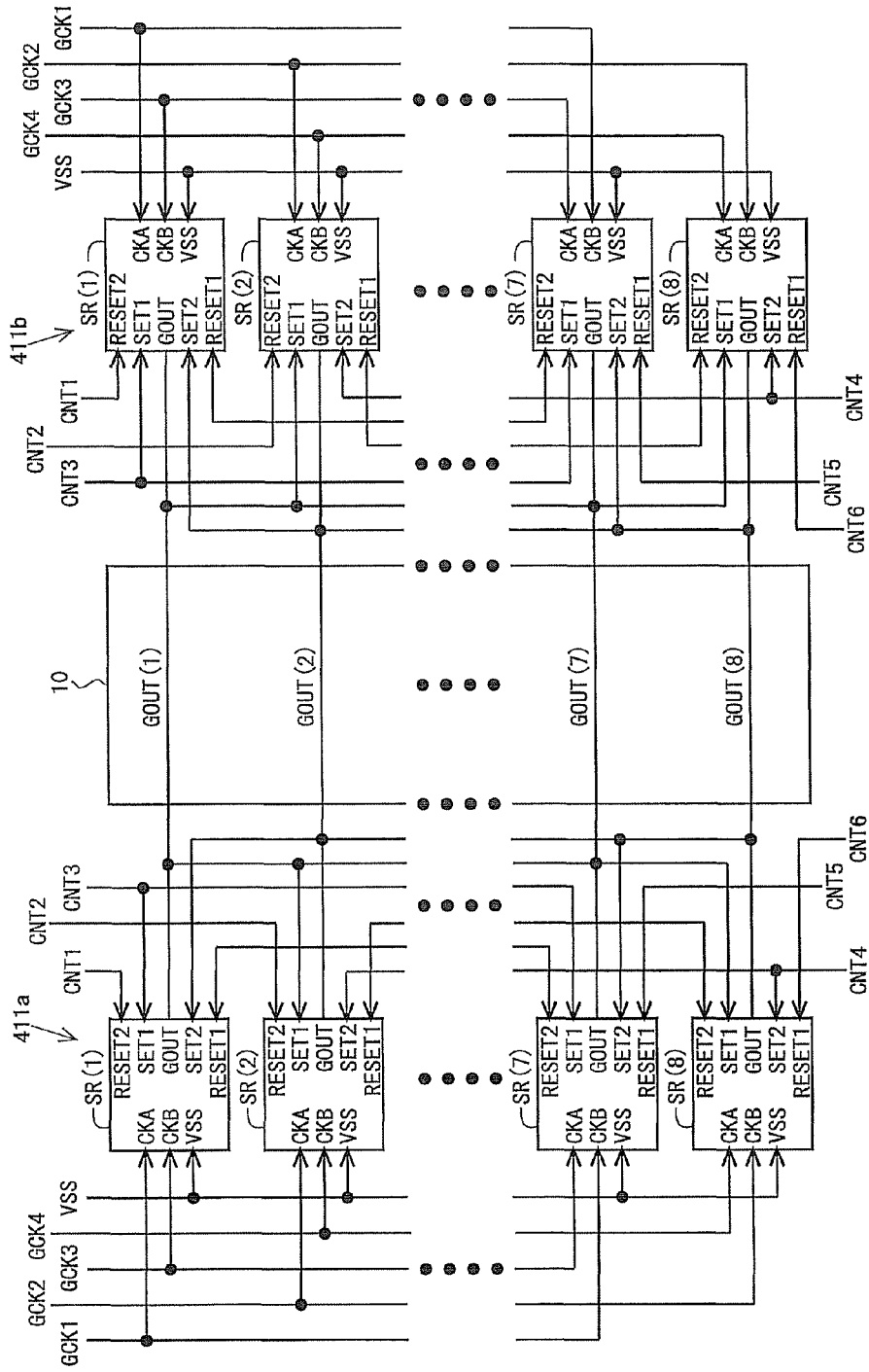
FIG. 10 is a block diagram showing a configuration of a shift register within a gate driver in a second embodiment of the present invention.

FIG. 10 is a block diagram showing a configuration of a shift register within the gate driver 40 in a second embodiment of the present invention. As shown in FIG. 10, this shift register is configured by a first shift register 411a within a gate driver provided at one side of the display unit 10, and a second shift register 411b within the gate driver provided at the other side of the display unit 10. Both the first shift register 411a and the second shift register 411b have a configuration similar to that of the shift register 410 (see FIG. 1) according to the first embodiment. Further, a configuration of each bistable circuit within the first shift register 411a and the second shift register 411b are similar to the configuration (see FIG. 5) in the first embodiment. Furthermore, an operation of each stage (bistable circuit) of the shift register and an overall operation of the shift register are also similar to those in the first embodiment, and therefore, their description is omitted.

2.2 Effects

Figure 11A:
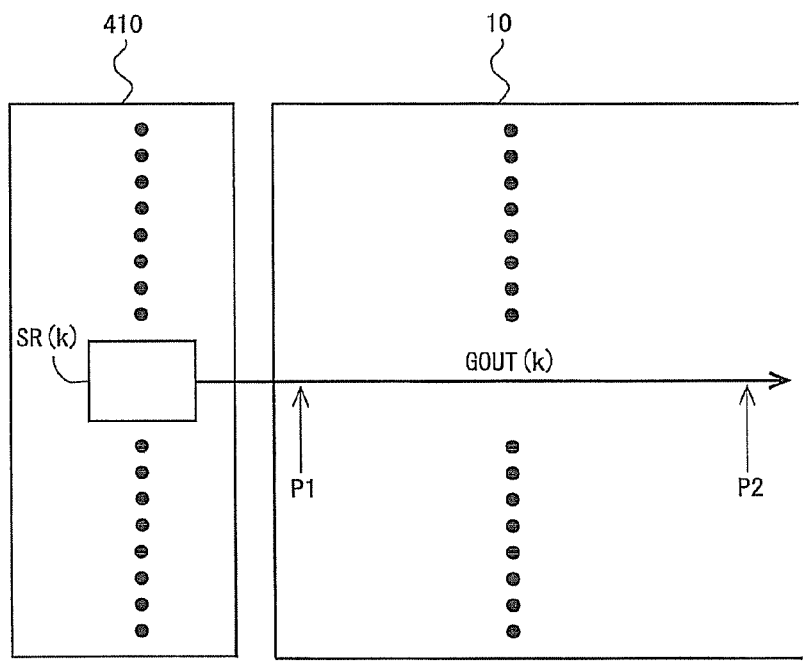
FIGS. 11A to 11C are diagrams for describing an effect of the second embodiment.
Figure 11B:
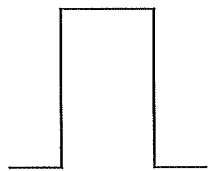
Figure 11C:
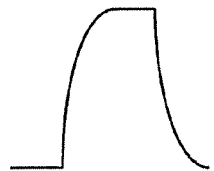

In general, a scanning signal outputted from a shift register generates a delay attributable to presence of a wiring capacitance (load) of a gate bus line. Particularly, in a display device that employs a large-type panel, when a gate driver is provided at only one side of the panel, a waveform of a scanning signal at a position near the shift register and a waveform of a scanning signal at a position far from the shift register are sometimes greatly different. For example, it sometimes occurs that a waveform of a scanning signal at a position indicated by an arrow marked by P1 in FIG. 11A becomes as shown in FIG. 11B, and that a waveform of a scanning signal at a position indicated by an arrow marked by P2 in FIG. 11A becomes as shown in FIG. 11C. In this case, a shortage of charge to a pixel capacitance occurs at a position far from the shift register, and the display quality lowers. Regarding this point, according to the present embodiment, charge is performed to one gate bus line from both sides of the display unit 10, and lowering of the display quality attributable to a shortage of charge in the large-type panel is suppressed.

3. Third Embodiment

3.1 A Configuration of a Shift Register

Figure 12:
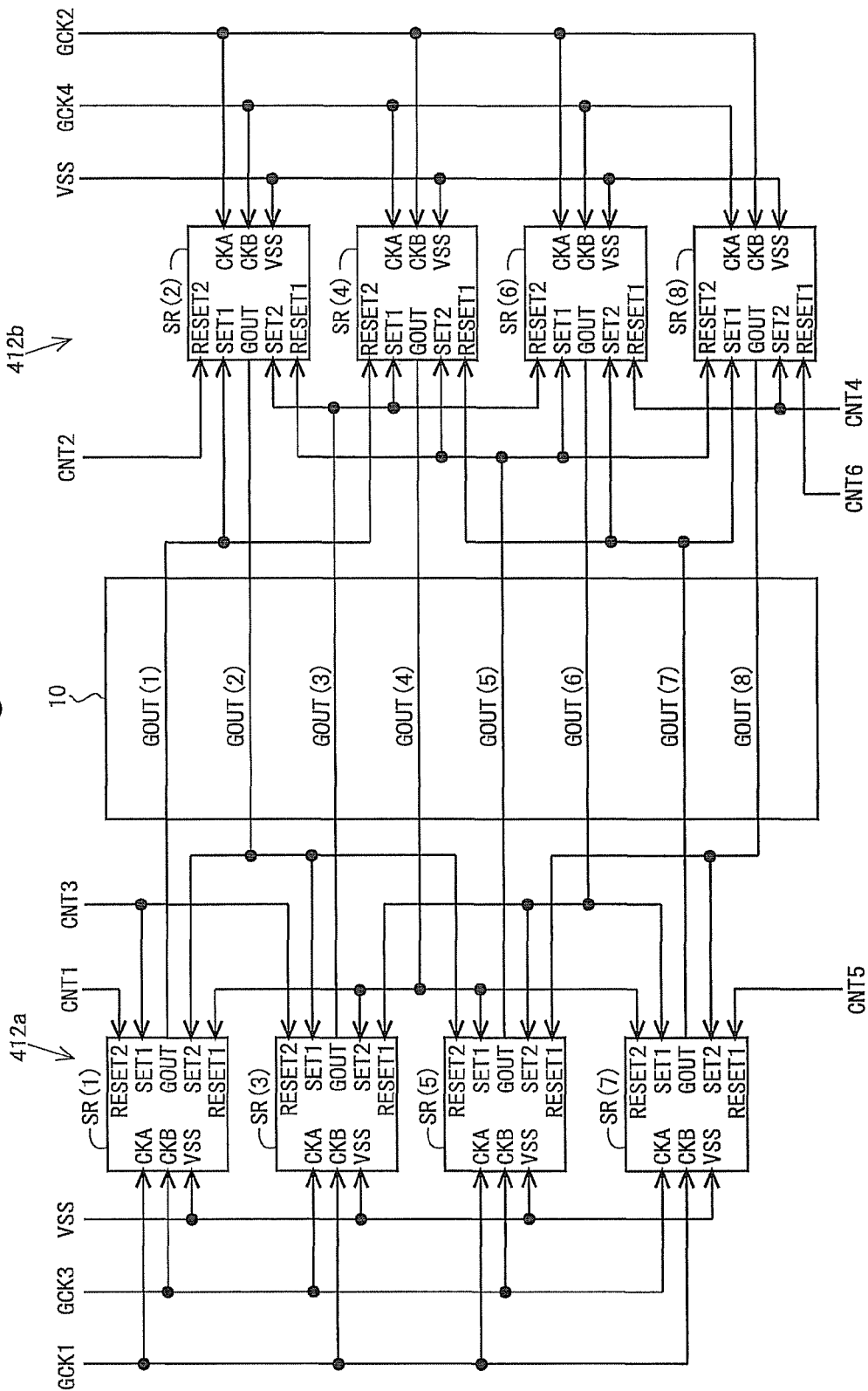
FIG. 12 is a block diagram showing a configuration of a shift register within a gate driver in a third embodiment of the present invention.

FIG. 12 is a block diagram showing a configuration of a shift register within the gate driver 40 in a third embodiment of the present invention. As shown in FIG. 12, this shift register is configured by a first shift register 412a within a gate driver provided at one side of the display unit 10, and a second shift register 412b within the gate driver provided at the other side of the display unit 10. More specifically, out of a bistable circuit within the shift register 410 (see FIG. 1) in the first embodiment, the odd-order stages SR(1), SR(3), SR(5), SR(7) are provided at one side of the display unit 10 (a left side of the display unit 10 in FIG. 12), and the even-order stages SR(2), SR(4), SR(6), SR(8) are provided at the other side of the display unit 10 (a right side of the display unit 10 in FIG. 12). Note that, a configuration and an operation of each bistable circuit and an overall operation of the shift register are similar to those in the first embodiment, and therefore, their description is omitted.

3.2 Effects

According to the present embodiment, a size per one stage of a shift register (a size in a direction to which a source bus line extends) can be set to approximately a half of the size in the first embodiment. Therefore, an area that is necessary as a picture-frame of a panel can be reduced, and reduction in sizes of various products that use a liquid crystal panel can be realized.

4. Fourth Embodiment

4.1 An Overall Configuration and a Configuration of a Gate Driver

In the present embodiment, an overall configuration and a configuration of a gate driver are substantially similar to the configurations in the first embodiment shown in FIGS. 1 to 3, and therefore, their detailed description is omitted.

4.2 A Configuration of a Bistable Circuit

Figure 13:
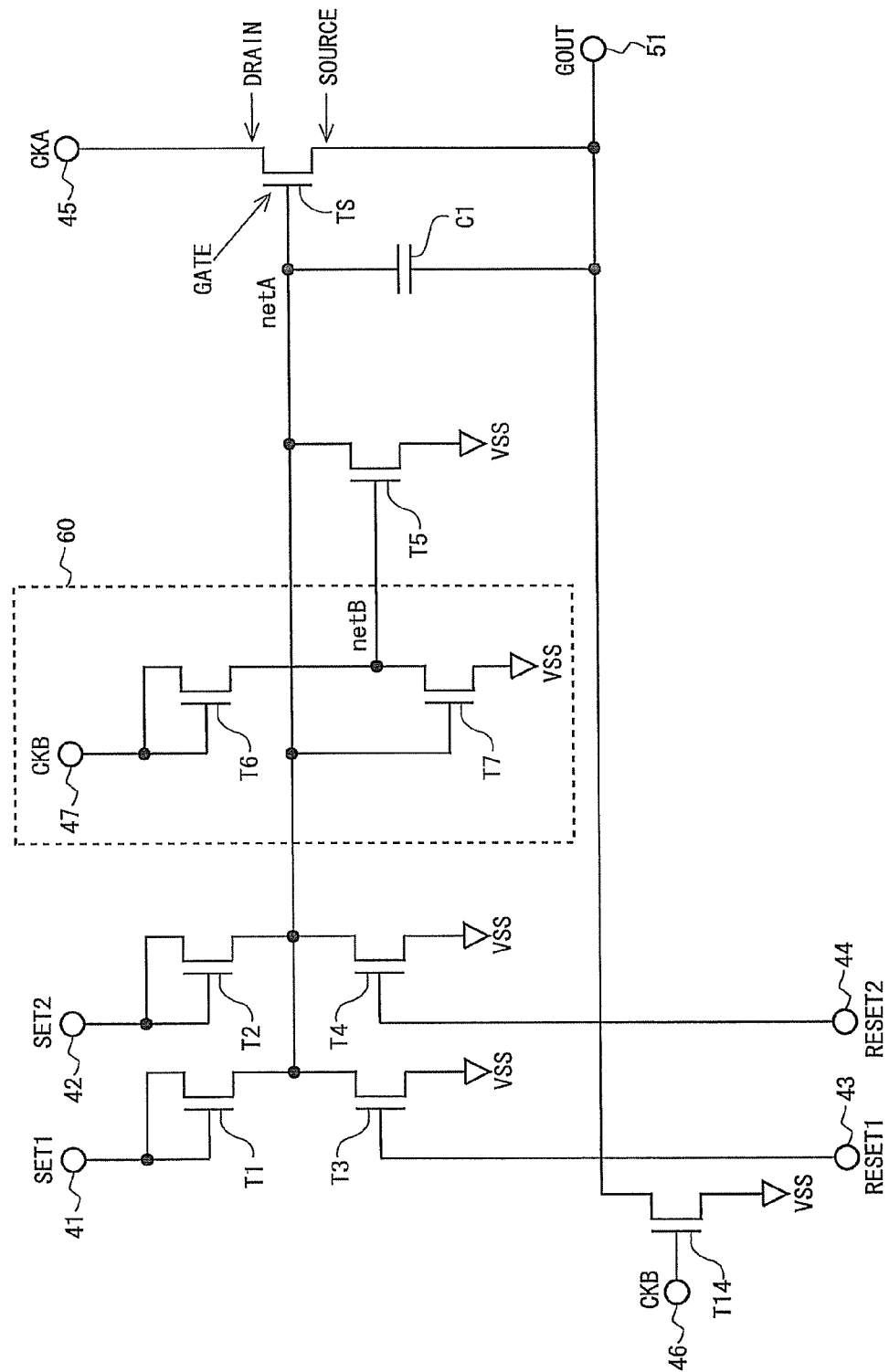
FIG. 13 is a circuit diagram showing a configuration of a bistable circuit included in a shift register in a fourth embodiment of the present invention.

FIG. 13 is a circuit diagram showing a configuration of a bistable circuit according to the present embodiment. In the present embodiment, in addition to the constituent elements in the first embodiment shown in FIG. 5, there are provided three thin-film transistors T5 (fifth switching element), T6 (sixth switching element), and T7 (seventh switching element), and an input terminal 47 that receives the second clock CKB. The input terminal 46 and the input terminal 47 may be the same terminal (one terminal)

A source terminal of the thin-film transistor T6, a drain terminal of the thin-film transistor T7, and a gate terminal of the thin-film transistor T5 are connected to each other. A region (wiring) in which these terminals are connected to each other is called a "netB" (second node) for convenience.

In the thin-film transistor T5, the gate terminal is connected to the netB, a drain terminal is connected to the netA, and a source terminal is connected to the power source voltage VSS. In the thin-film transistor T6, a gate terminal and a drain terminal are connected to the input terminal 47 (that is, in a diode connection), and the source terminal is connected to the netB. In the thin-film transistor T7, a gate terminal is connected to the netA, the drain terminal is connected to the netB, and a source terminal is connected to the power source voltage VSS. With this, a circuit of a portion indicated by a symbol 60 in FIG. 13 is an AND circuit that outputs AND of a logical value of a logical inversion signal of a signal that indicates a potential of the netA and a logical value of the second clock CKB. In the present embodiment, a second node control unit is realized by this AND circuit.

The thin-film transistor T5 sets a potential of the netA to a low level, when a potential of the netB is at a high level. The thin-film transistor T6 sets a potential of the netB to a high level, when the second clock CKB is at a high level. The thin-film transistor T7 sets a potential of the netB to a low level, when a potential of the netA is at a high level. Therefore, when the potential of the netA is at the low level and the second clock CKB is at the high level, the thin-film transistor T5 becomes in an on stage, and the potential of the netA is pulled to a potential of the power source voltage VSS.

<An Operation of a Shift Register>

Figure 14:
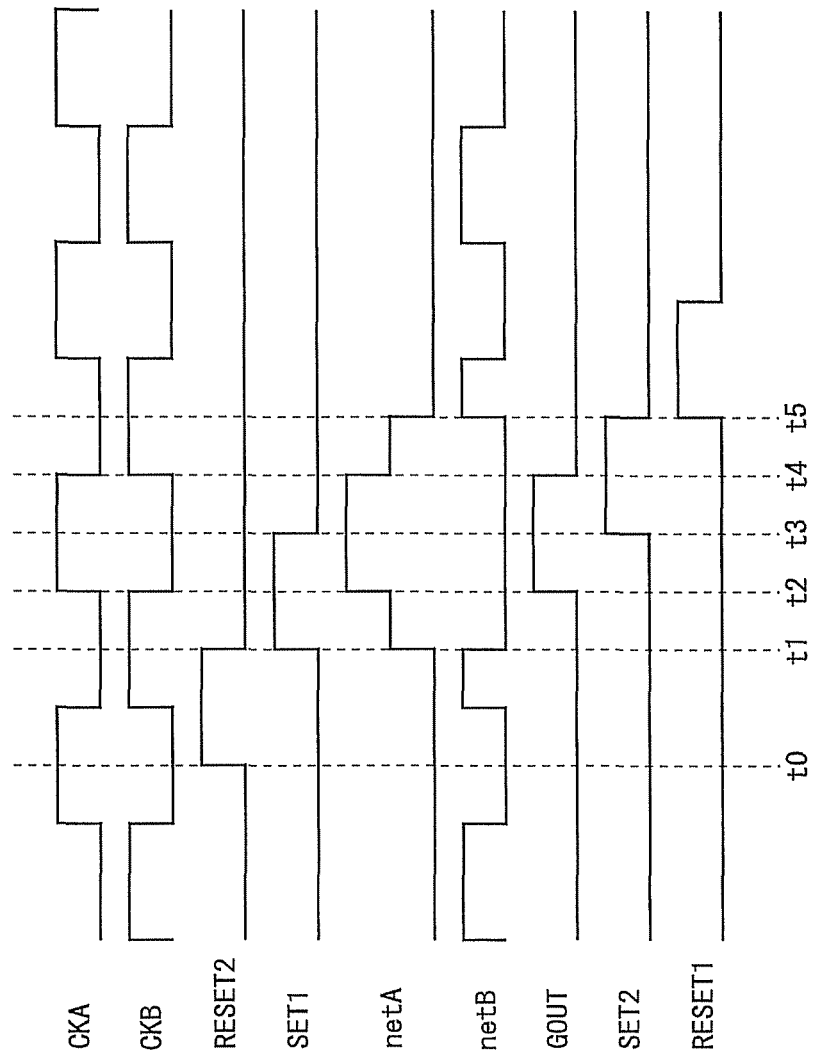
FIG. 14 is a timing chart for describing an operation of each stage of the shift register when a forward scanning is performed in the fourth embodiment.
Figure 15:
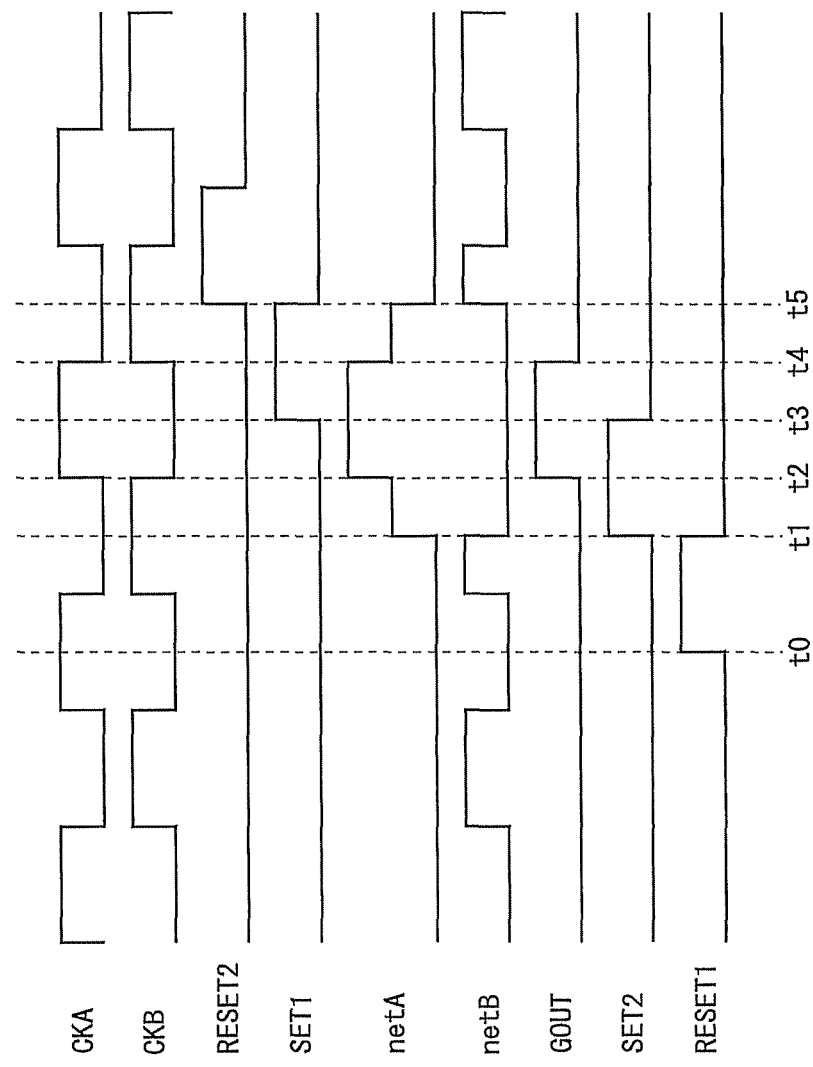
FIG. 15 is a timing chart for describing an operation of each stage of the shift register when a backward scanning is performed in the fourth embodiment.

An operation of each stage (bistable circuit) of the shift register 410 in the present embodiment is described next with reference to FIGS. 13 to 15. FIG. 14 is a timing chart when a forward scanning is performed, and FIG. 15 is a timing chart when a backward scanning is performed. An overall operation of the shift register 410 is similar to that in the first embodiment, and therefore, its description is omitted.

<4.3.1> An Operation when a Forward Scanning is Performed>

An operation of the bistable circuit when performing a forward scanning is described. As shown in FIG. 14, during an operation of the liquid crystal display device, the first clock CKA is provided to the input terminal 45, and the second clock CKB is provided to the input terminal 46 and the input terminal 47.

During a period before a time point t1, an operation similar to that in the first embodiment is performed, except that the potential of the netB becomes at the high level every predetermined period in accordance with a change of the potential of the second clock CKB and the thin-film transistor T5 becomes in an on state. Specifically, during the period before the time point t1, while the potential of the netA is maintained at the low level, the potential of the second clock CKB is alternately repeated at the high level and the low level every predetermined period. As described above, the thin-film transistor T5 becomes in an on state, when the potential of the netA is at the low level and the second clock CKB is at the high level. Therefore, during the period before the time point t1, the thin-film transistor T5 becomes in an on state during the period when the second clock CKB is at the high level.

When reaching the time point t1, a pulse of the first set signal SET1 is provided to the input terminal 41. Accordingly, the potential of the netA changes from the low level to the high level, and the thin-film transistor TS becomes in an on state, in a similar manner to that in the first embodiment. During a period from the time point t1 to a time point t2, the scanning signal GOUT is maintained at a low level, in a similar manner to that in the first embodiment. Incidentally, in the present embodiment, the gate terminal of the thin-film transistor T7 is connected to the netA. Therefore, by the potential of the netA becoming at the high level, the thin-film transistor T7 becomes in an on state. Because the potential of the netB becomes at the low level, the thin-film transistor T5 becomes in an off state. Accordingly, during the period from the time point t1 to the time point t2, it does not occur that "the thin-film transistor T5 becomes in an on state and the potential of the netA decreases".

When reaching the time point t2, the first clock CKA changes from the low level to the high level. Accordingly, the potential of the netA increases, in a similar manner to that in the first embodiment. Then, the potential of the scanning signal GOUT increases to a high-level potential of the first clock CKA, and a gate bus line connected to the output terminal 51 of the bistable circuit becomes in a selected state. Incidentally, because the potential of the netA is at the high level from the time point t1, the thin-film transistor T7 is maintained in the on state. During a period from the time point t2 to a time point t3, because the second clock CKB is at a low level, the thin-film transistor T6 is in an off state. Therefore, during the period from the time point t2 to the time point t3, the potential of the netB becomes at the low level, the thin-film transistor T5 becomes in an off state. Accordingly, during the period from the time point t2 to the time point t3, it does not occur that "the thin-film transistor T5 becomes in an on state and the potential of the netA decreases".

When reaching the time point t3, a pulse of the second set signal SET2 is provided to the input terminal 42. Accordingly, although the thin-film transistor T2 becomes in an on state, the potential of the netA does not vary due to the thin-film transistor T2 becoming in the on state, in a similar manner to that in the first embodiment. Because the potential of the first clock CKA and the potential of the second clock CKB do not change at the time point t3, the netA and the scanning signal GOUT maintain the potentials at the time point t2 to the time point t3.

When reaching the time point t4, the first clock CKA changes from the high level to the low level, and the second clock CKB changes from the low level to the high level. Accordingly, the potential of the scanning signal GOUT becomes at a low level, in a similar manner to that in the first embodiment. The potential of the netA becomes lower than that during a period from the time point t2 to a time point t4, but is maintained in the high-level state. Therefore, also during a period after the time point t4, the thin-film transistor T7 is maintained in the on state. Accordingly, because the potential of the netB becomes at the low level, the thin-film transistor T5 becomes in an off state. Therefore, during a period from the time point t4 to a time point t5, it does not occur that "the thin-film transistor T5 becomes in an on state and the potential of the netA decreases". During a period after the time point t5, an operation similar to that in the first embodiment is performed, except that the potential of the netB becomes at the high level every predetermined period in accordance with a change of the potential of the second clock CKB and the thin-film transistor T5 becomes in an on state.

<4.3.2 An Operation when a Backward Scanning is Performed>

An operation of the bistable circuit when performing a backward scanning is described. As shown in FIG. 15, during an operation of the liquid crystal display device, the first clock CKA is provided to the input terminal 45, and the second clock CKB is provided to the input terminal 46 and the input terminal 47.

During a period before a time point t1, an operation similar to that in the first embodiment is performed, except that a potential of the netB becomes at a high level every predetermined period in accordance with a change of the potential of the second clock CKB and the thin-film transistor T5 becomes in an on state. When reaching the time point t1, a pulse of the second set signal SET2 is provided to the input terminal 42. Accordingly, the potential of the netA changes from the low level to a high level, and the thin-film transistor TS becomes in an on state, in a similar manner to that in the first embodiment. During a period from the time point t1 to a time point t2, the scanning signal GOUT is maintained at a low level, in a similar manner to that in the first embodiment. During the period from the time point t1 to the time point t2, it does not occur that "the thin-film transistor T5 becomes in an on state and the potential of the netA decreases", in a similar manner to that of the forward scanning.

When reaching the time point t2, the first clock CKA changes from the low level to the high level. Accordingly, the potential of the netA increases, in a similar manner to that in the first embodiment. Then, the potential of the scanning signal GOUT increases to a high-level potential of the first clock CKA, and a gate bus line connected to the output terminal 51 of the bistable circuit becomes in a selected state. Further, the potential of the netA is at the high level from the time point t1. During a period from the time point t2 to a time point t3, it does not occur that "the thin-film transistor T5 becomes in an on state and the potential of the netA decreases", in a similar manner to that of the forward scanning.

When reaching the time point t3, a pulse of the first set signal SET1 is provided to the input terminal 41. Accordingly, although the thin-film transistor T1 becomes in an on state, the potential of the netA does not vary due to the thin-film transistor T1 becoming in the on state, in a similar manner to that in the first embodiment. Further, because the potential of the first clock CKA and the potential of the second clock CKB do not change at the time point t3, the netA and the scanning signal GOUT maintain the potentials at the time point t2 to the time point t3.

When reaching the time point t4, the first clock CKA changes from the high level to the low level, and the second clock CKB changes from the low level to the high level. Accordingly, the potential of the scanning signal GOUT becomes at a low level, in a similar manner to that in the first embodiment. The potential of the netA becomes lower than that during a period from the time point t2 to a time point t4, but is maintained in the high-level state. Therefore, during a period from the time point t4 to a time point t5, it does not occur that "the thin-film transistor T5 becomes in an on state and the potential of the netA decreases", in a similar manner to that of the forward scanning. During a period after the time point t5, an operation similar to that in the first embodiment is performed, except that the potential of the netB becomes at the high level every predetermined period in accordance with a change of the potential of the second clock CKB and the thin-film transistor T5 becomes in an on state.

4.4 Effects

According to the present embodiment, both in performing the forward scanning and also in performing the backward scanning, during a period before the time point t1 and during, a period after the time point t5, the potential of the netB becomes at the high level every predetermined period in accordance with a change of the potential of the second clock CKB (see FIGS. 14 and 15). Therefore, during the period before the time point t1 and during the period after the time point t5, the thin-film transistor T5 becomes in an on state every predetermined period. Consequently, even when a shift of a threshold voltage of the thin-film transistor TS occurs due to high-temperature aging and a leakage current in the thin-film transistor TS becomes large, for example, the potential of the netA is securely set to the low level every predetermined period, and output of an abnormal pulse from the output terminal 51 is suppressed. Further, occurrence of an abnormal operation of a shift register due to sequential application of such an abnormal pulse to a latter stage is suppressed.

4.5 Modifications

The configuration may be such that a thin-film transistor that sets a potential of the netB to a low level when the first clock CKA is at a high level is provided, in addition to the configuration shown in FIG. 13. With this, the potential of the netB is securely set to a low level during a period when the first clock CKA is at a high level. Therefore, a shift of the threshold voltage of the thin-film transistor T5 is suppressed.

5. Fifth Embodiment 5.1 An Overall Configuration and a Configuration of a Gate Driver In the present embodiment, an overall configuration and a schematic configuration of a gate driver are substantially similar to the configurations in the first embodiment shown in FIGS. 2 and 3, and therefore, their detailed description is omitted.

5.2 A Configuration of a Shift Register

Figure 16:
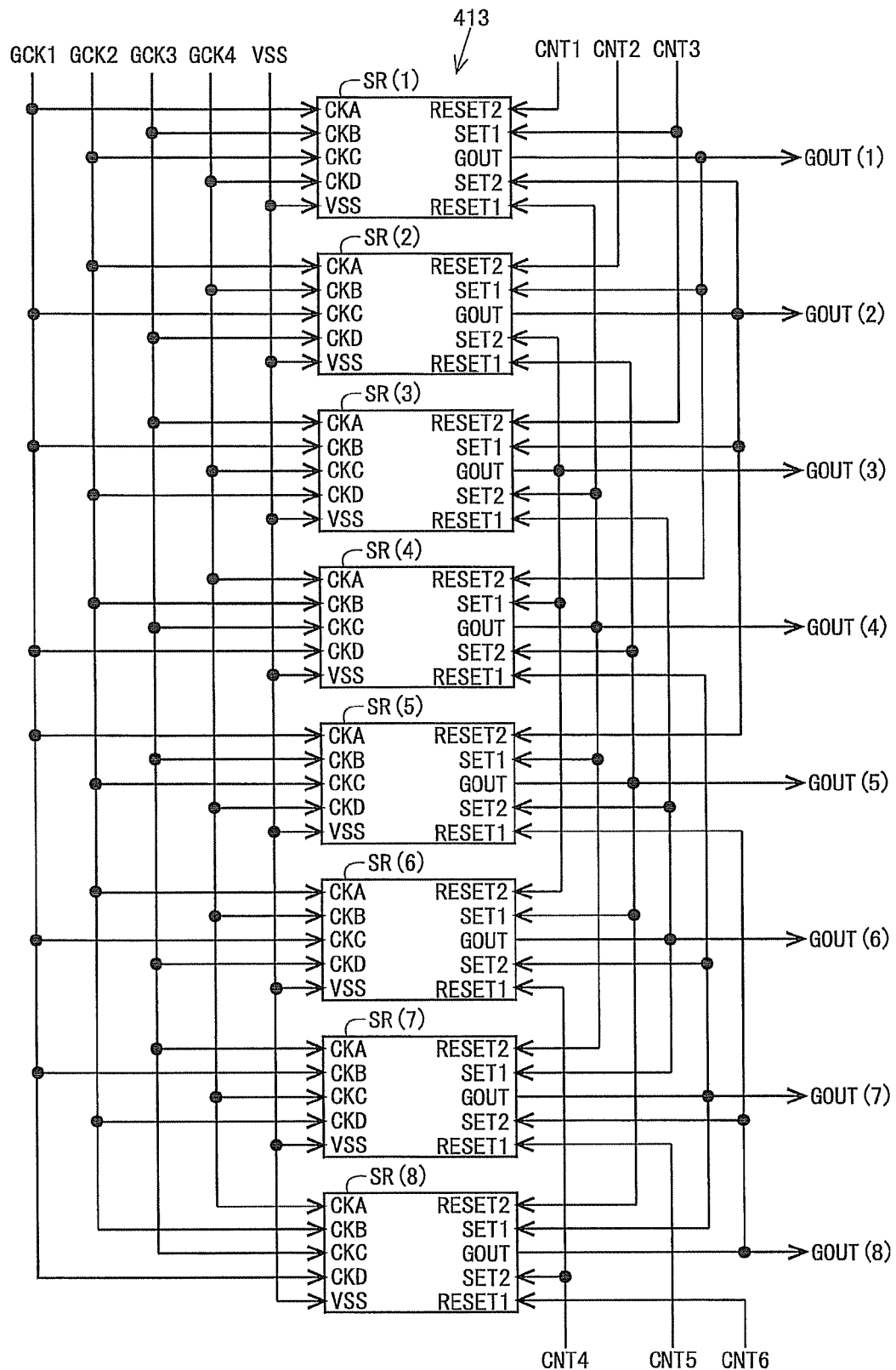
FIG. 16 is a block diagram showing a configuration of a shift register within a gate driver in a fifth embodiment of the present invention.

FIG. 16 is a block diagram showing a configuration of a shift register 413 within the gate driver 40 in the present embodiment. As shown in FIG. 16, the shift register 413 is configured by eight bistable circuits SR(1) to SR(8). Each bistable circuit is provided with input terminals for receiving four-phase clock signals CKA, CKB, CKC (hereinafter, referred to as a "third clock", and CKD (hereinafter, referred to as a "fourth clock") respectively, an input terminal for receiving a low-level power source voltage VSS, an input terminal for receiving a first set signal SET1, an input terminal for receiving a second set signal SET2, an input terminal for receiving a first reset signal RESET1, an input terminal for receiving a second reset signal RESET2, and an output terminal for outputting a scanning signal GOUT.

The four-phase clock signals CKA, CKB, CKC, and CKD that are inputted to each stage (each bistable circuit) are described below. Note that the first set signal SET1, the second set signal SET2, the first reset signal RESET1, the second reset signal RESET2, and the power source voltage VSS are similar to those in the first embodiment, and therefore, their description is omitted.

In the first stage SR(1) and the fifth stage SR(5), the first gate clock signal GCK1 is provided as the first clock CKA, the third gate clock signal GCK3 is provided as the second clock CKB, the second gate clock signal GCK2 is provided as the third clock CKC, and the fourth gate clock signal GCK4 is provided as the fourth clock CKD.

In the second stage SR(2) and the sixth stage SR(6), the second gate clock signal GCK2 is provided as the first clock CKA, the fourth gate clock signal GCK4 is provided as the second clock CKB, the first gate clock signal GCK1 is provided as the third clock CKC, and the third gate clock signal GCK3 is provided as the fourth clock CKD.

In the third stage SR(3) and the seventh stage SR(7), the third gate clock signal GCK3 is provided as the first clock CKA, the first gate clock signal GCK1 is provided as the second clock CKB, the fourth gate clock signal GCK4 is provided as the third clock CKC, and the second gate clock signal GCK2 is provided as the fourth clock CKD.

In the fourth stage SR(4) and the eighth stage SR(8), the fourth gate clock signal GCK4 is provided as the first clock CKA, the second gate clock signal GCK2 is provided as the second clock CKB, the third gate clock signal GCK3 is provided as the third clock CKC, and the first gate clock signal GCK1 is provided as the fourth clock CKD.

5.3 A Configuration of a Bistable Circuit

Figure 17:
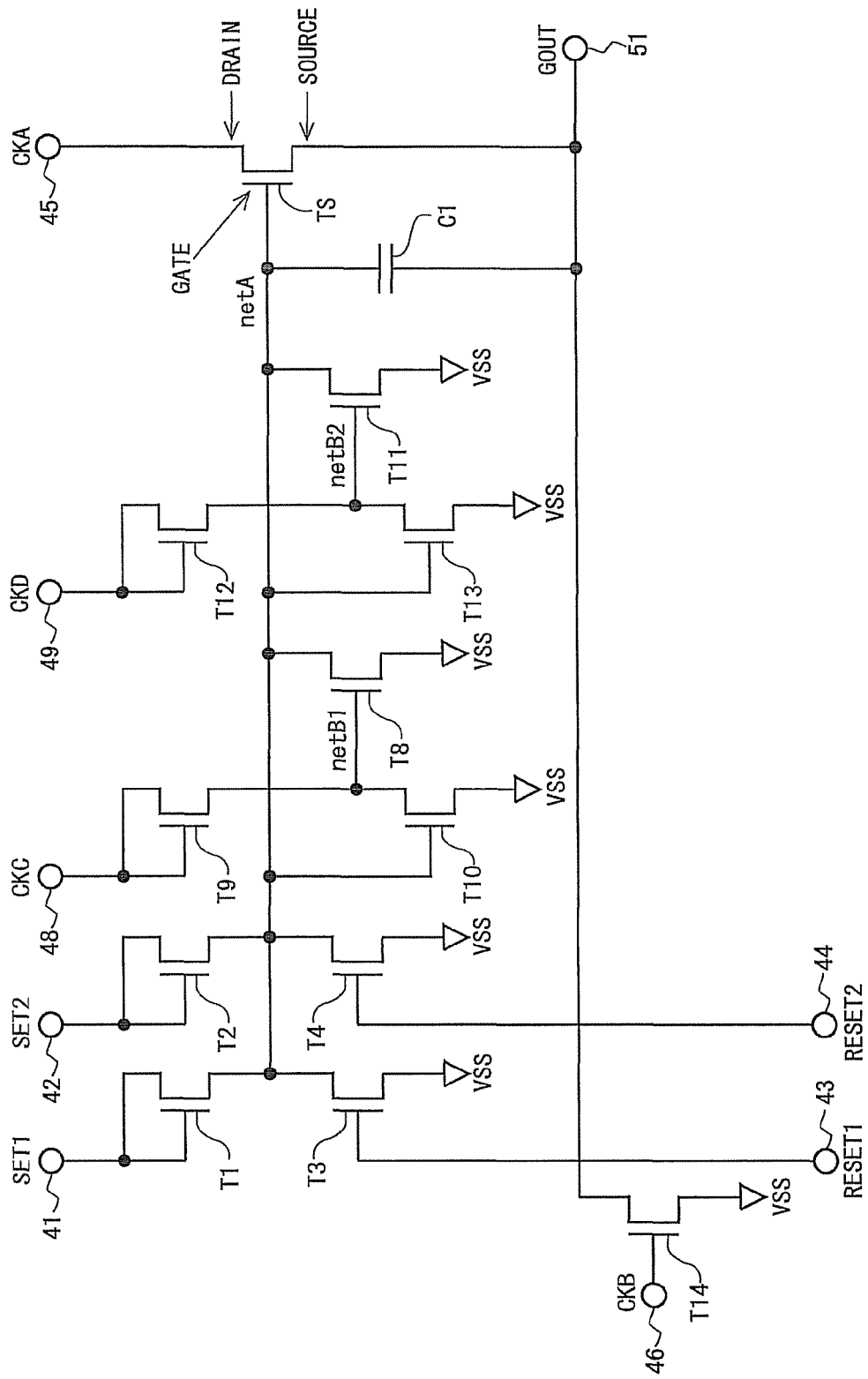
FIG. 17 is a circuit diagram showing a configuration of a bistable circuit included in the shift register in the fifth embodiment.

FIG. 17 is a circuit diagram showing a configuration of a bistable circuit according to the present embodiment. In the present embodiment, in addition to the constituent elements in the first embodiment shown in FIG. 5, there are provided six thin-film transistors T8 to T13 (eighth to thirteenth switching elements), an input terminal 48 that receives the third clock CKC, and an input terminal 49 that receives the fourth clock CKD.

A gate terminal of a thin-film transistor T8, a source terminal of a thin-film transistor T9, and a drain terminal of a thin-film transistor T10 are connected to each other. A region (wiring) in which these terminals are connected to each other is called a "netB1" (third node) for convenience. A gate terminal of a thin-film transistor T11, a source terminal of a thin-film transistor T12, and a drain terminal of the thin-film transistor T13 are connected to each other. A region (wiring) in which these terminals are connected to each other is called a "netB2" (fourth node) for convenience.

In the thin-film transistor T8, the gate terminal is connected to the netB1, a drain terminal is connected to the netA, and a source terminal is connected to the power source voltage VSS. In the thin-film transistor T9, a gate terminal and a drain terminal are connected to the input terminal 48 (that is, in a diode connection), and the source terminal is connected to the netB1. In the thin-film transistor T10, a gate terminal is connected to the netA, the drain terminal is connected to the netB1, and a source terminal is connected to the power source voltage VSS. The thin-film transistor T8 sets a potential of the netA to a low level, when a potential of the netB1 is at a high level. The thin-film transistor T9 sets a potential of the netB1 to a high level, when the third clock CKC is at a high level. The thin-film transistor T10 sets a potential of the netB1 to a low level, when a potential of the netA is at a high level.

In the thin-film transistor T11, the gate terminal is connected to the netB2, a drain terminal is connected to the netA, and a source terminal is connected to the power source voltage VSS. In the thin-film transistor T12, a gate terminal and a drain terminal are connected to the input terminal 49 (that is, in a diode connection), and the source terminal is connected to the netB2. In the thin-film transistor T13, a gate terminal is connected to the netA, the drain terminal is connected to the netB2, and a source terminal is connected to the power source voltage VSS. The thin-film transistor T11 sets a potential of the netA to a low level, when a potential of the netB2 is at a high level. The thin-film transistor T12 sets a potential of the netB2 to a high level, when the fourth clock CKD is at a high level. The thin-film transistor T13 sets a potential of the netB2 to a low level, when a potential of the netA is at a high level.

5.4 An Operation of a Shift Register

Figure 18:
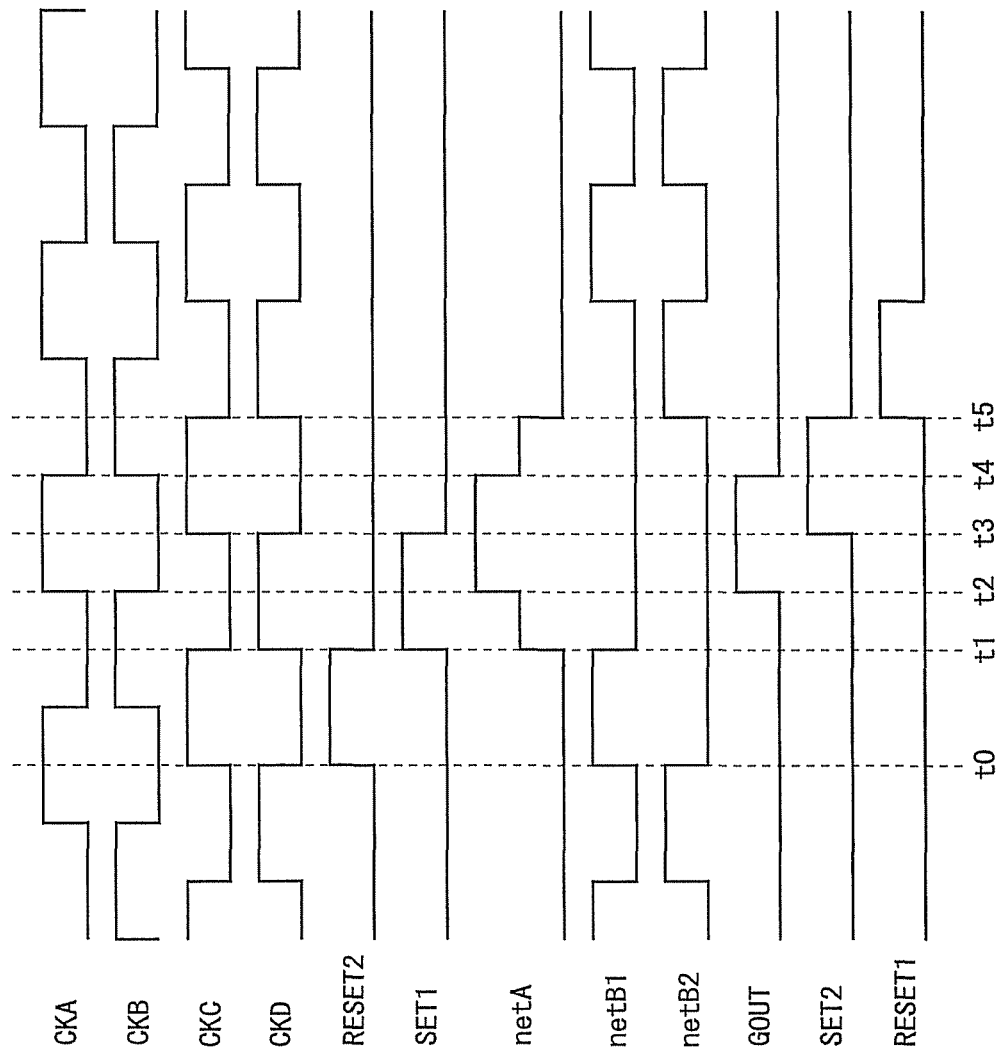
FIG. 18 is a timing chart for describing an operation of each stage of the shift register when a forward scanning is performed in the fifth embodiment.
Figure 19:
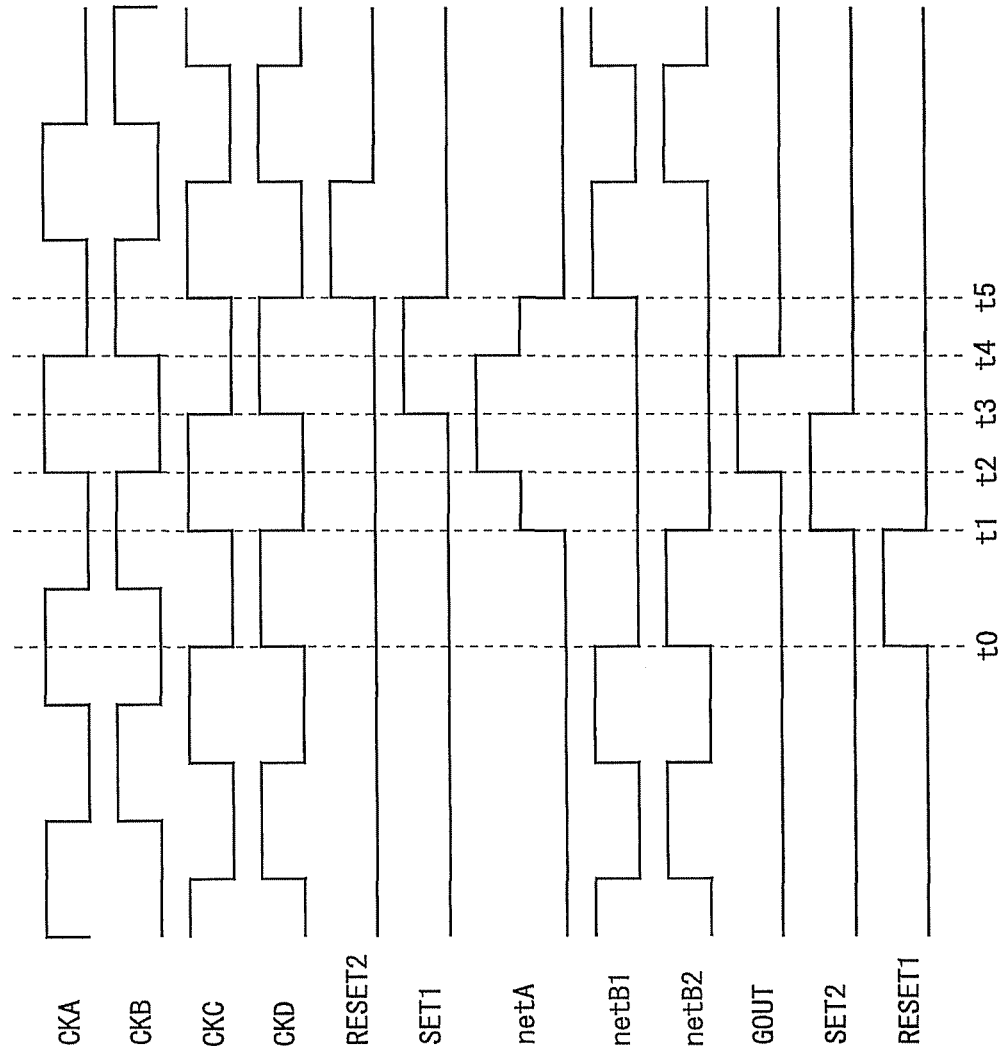
FIG. 19 is a timing chart for describing an operation of each stage of the shift register when a backward scanning is performed in the fifth embodiment.

An operation of each stage (bistable circuit) of the shift register 413 in the present embodiment is described next with reference to FIGS. 17 to 19. FIG. 18 is a timing chart when a forward scanning is performed, and FIG. 19 is a timing chart when a backward scanning is performed. An overall operation of the shift register 413 is similar to that in the first embodiment, and therefore, its description is omitted.

<5.4.1 An Operation when a Forward Scanning is Performed>

An operation of a bistable circuit when performing a forward scanning is described. As shown in FIG. 18, during an operation of the liquid crystal display device, the first clock CKA is provided to the input terminal 45, the second clock CKB is provided to the input terminal 46, the third clock CKC is provided to the input terminal 48, and the fourth clock CKD is provided to the input terminal 49. In this way, in the present embodiment, four-phase clock signals of which phases are shifted by 90 degrees from each other are provided to a bistable circuit.

During a period before a time point t1, both a potential of the netA and a potential of the scanning signal GOUT (a potential of the output terminal 51) are at a low level. During the period before the time point t1, a potential of the netB1 is alternately repeated at a high level and a low level based on the third clock CKC, and a potential of the netB2 is alternately repeated at a low level and a high level based on the fourth clock CKD. Accordingly, during the period before the time point t1, the thin-film transistor T8 and the thin-film transistor T11 become in an on state every predetermined period.

When reaching the time point t1, a pulse of the first set signal SET1 is provided to the input terminal 41. Accordingly, the potential of the netA changes from the low level to a high level, and the thin-film transistor TS becomes in an on state, in a similar manner to that in the first embodiment. During a period from the time point t1 to a time point t2, the scanning signal GOUT is maintained at a low level, because the first clock CKA is at the low level. Incidentally, in the present embodiment, the gate terminals of the thin-film transistors T10, T13 are connected to the netA. Therefore, by the potential of the netA becoming at a high level, the thin-film transistors T10, T13 become in an on state. Because the potentials of the netB1 and the netB2 become at a low level accordingly, the thin-film transistors T8, T11 become in an off state. Accordingly, during the period from the time point t1 to the time point t2, it does not occur that "the thin-film transistor T8 or the thin-film transistor T11 becomes in an on state and the potential of the netA decreases".

When reaching the time point t2, the first clock CKA changes from the low level to the high level. Accordingly, in a similar manner to that in the first embodiment, the potential of the scanning signal GOUT increases to a high-level potential of the first clock CKA, and a gate bus line connected to the output terminal 51 of the bistable circuit becomes in a selected state. Incidentally, because the potential of the netA is at the high level from the time point t1, the thin-film transistors T10, T13 are maintained in the on state. Therefore, during a period from the time point t2 to a time point t3, a potential of the netB1 and a potential of the netB2 become at a low level, and the thin-film transistors T8, T11 become in an off state. Therefore, during the period from the time point t2 to the time point t3, it does not occur that "the thin-film transistor T8 or the thin-film transistor T11 becomes in an on state and the potential of the netA decreases".

When reaching the time point t3, a pulse of the second set signal SET2 is provided to the input terminal 42. Accordingly, although the thin-film transistor T2 becomes in an on state, the potential of the netA does not vary due to the thin-film transistor T2 becoming in the on state, in a similar manner to that in the first embodiment. Further, because the potential of the first clock CKA and the potential of the second clock CKB do not change at the time point t3, the netA and the scanning signal GOUT maintain the potentials at the time point t2 to the time point t3.

When reaching the time point t4, the first clock CKA changes from the high level to a low level, and the second clock CKB changes from the low level to a high level. Accordingly, the potential of the scanning signal GOUT becomes at a low level, in a similar manner to that in the first embodiment. The potential of the netA becomes lower than that during a period from the time point t2 to a time point t4, but is maintained in the high-level state. Therefore, during a period after the time point t4, the thin-film transistors T10, T13 are maintained in the on state. Because a potential of the netB1 and a potential of the netB2 become at a low level accordingly, the thin-film transistors T8, T11 become in an off state. Therefore, during a period from the time point t4 to a time point t5, it does not occur that "the thin-film transistor T8 or the thin-film transistor T11 becomes in an on state and the potential of the netA decreases". During a period after the time point t5, the thin-film transistor T8 and the thin-film transistor T11 become in an on state every predetermined period, in a similar manner to that before the time point to.

<5.4.2 An Operation when a Backward Scanning is Performed>

An operation of the bistable circuit when performing a backward scanning is described. As shown in FIG. 19, during an operation of the liquid crystal display device, the first clock CKA is provided to the input terminal 45, the second clock CKB is provided to the input terminal 46, the third clock CKC is provided to the input terminal 48, and the fourth clock CKD is provided to the input terminal 49.

During a period before a time point t1, both the thin-film transistor T8 and the thin-film transistor T11 become in an on state every predetermined period, in a similar manner to that when the forward scanning is performed. When reaching the time point t1, a pulse of the second set signal SET2 is provided to the input terminal 42. Accordingly, the potential of the netA changes from the low level to a high level, and the thin-film transistor TS becomes in an on state. During a period from the time point t1 to a time point t2, the scanning signal GOUT is maintained at a low level, because the first clock CKA is at the low level. Note that during the period from the time point t1 to the time point t2, it does not occur that "the thin-film transistor T8 or the thin-film transistor T11 becomes in an on state and the potential of the netA decreases", in a similar manner to that when the forward scanning is performed.

When reaching the time point t2, the first clock CKA changes from the low level to a high level. Accordingly, the potential of the scanning signal GOUT increases to a high-level potential of the first clock CKA, and a gate bus line connected to the output terminal 51 of the bistable circuit becomes in a selected state, in a similar manner to that in the first embodiment. Note that during the period from the time point t2 to the time point t3, it does not occur that "the thin-film transistor T8 or the thin-film transistor T11 becomes in an on state and the potential of the netA decreases", in a similar manner to that when the forward scanning is performed.

When reaching the time point t3, a pulse of the first set signal SET1 is provided to the input terminal 41. Accordingly, although the thin-film transistor T1 becomes in an on state, the potential of the netA does not vary due to the thin-film transistor T1 becoming in the on state, in a similar manner to that in the first embodiment. Further, because the potential of the first clock CKA and the potential of the second clock CKB do not change at the time point t3, the netA, and the scanning signal GOUT maintain the potentials at the time point t2 to the time point t3.

When reaching the time point t4, the first clock CKA changes from the high level to the low level, and the second clock CKB changes from the low level to the high level. Accordingly, the potential of the scanning signal GOUT becomes at a low level, in a similar manner to that in the first embodiment. The potential of the netA becomes lower than that during a period from the time point t2 to a time point t4, but is maintained in the high-level state. Therefore, also during a period after the time point t4, the thin-film transistors T10, T13 are maintained in the on state. Because a potential of the netB1 and a potential of the netB2 become at a low level accordingly, the thin-film transistors T8, T11 become in an off state. Therefore, during a period from the time point t4 to a time point t5, it does not occur that "the thin-film transistor T8 or the thin-film transistor T11 becomes in an on state and the potential of the netA decreases". During a period after the time point t5, the thin-film transistor T8 and the thin-film transistor T11 become in an on state every predetermined period, in a similar manner to that when a forward scanning is performed.

5.5 Effects

Figure 20:
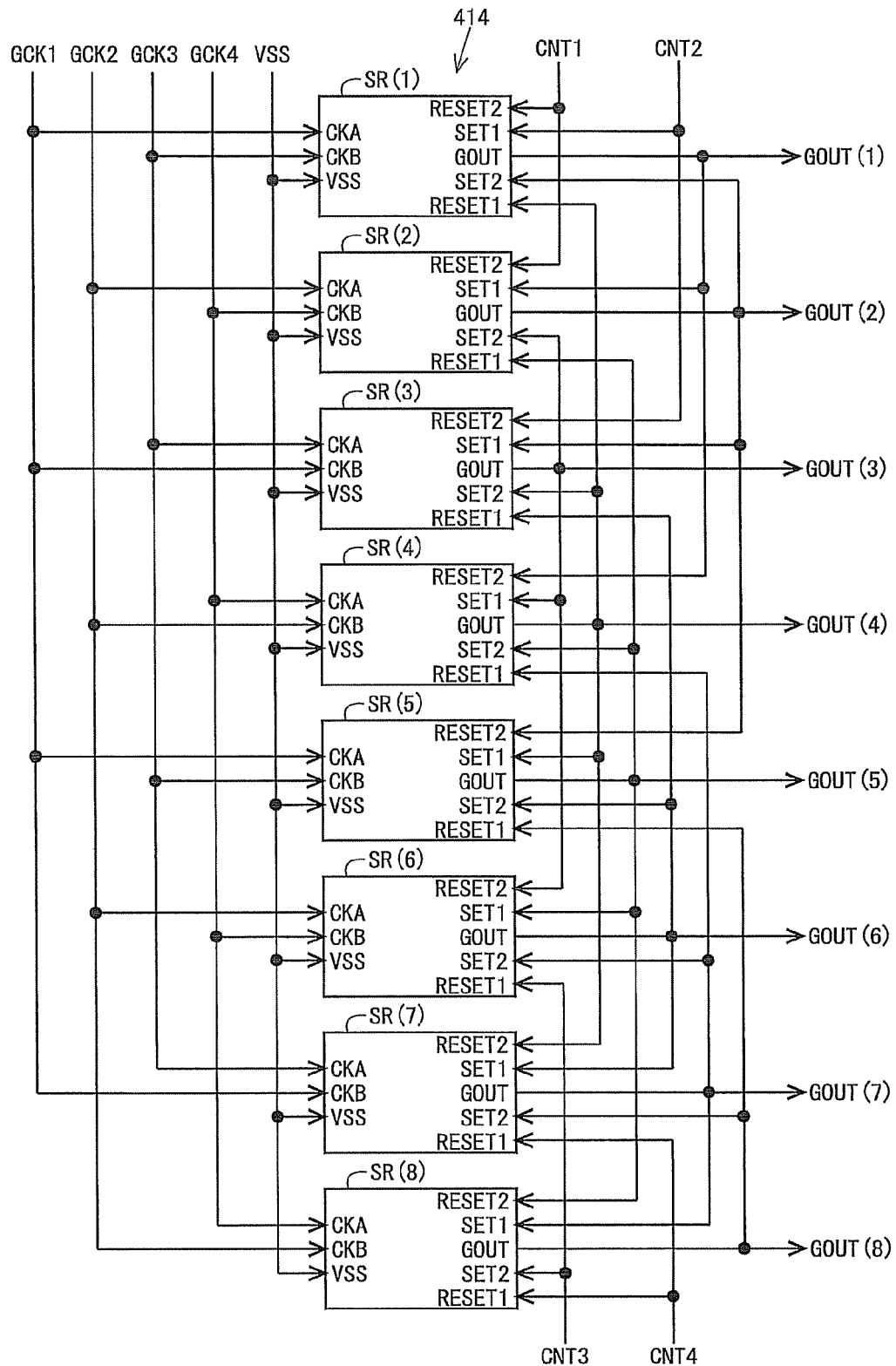
FIG. 20 is a block diagram showing a configuration of a shift register within a gate driver in a sixth embodiment of the present invention.

According to the present embodiment, both in performing the forward scanning and also in performing the backward scanning, during a period before the time point t1 and during a period after the time point t5, a potential of the netB1 becomes at a high level every predetermined period in accordance with a change of a potential of the third clock CKC, and a potential of the netB2 becomes at a high level every predetermined period in accordance with a change of a potential of the fourth clock CKD (see FIGS. 19 and 20). In this case, a phase of the third clock CKC and a phase of the fourth clock CKD are shifted by 180 degrees from each other. Therefore, during a period before the time point t1 and during a period after the time point t5, either the thin-film transistor T8 or the thin-film transistor T11 is in an on state. Therefore, even when a shift of a threshold voltage of the thin-film transistor TS occurs due to high-temperature aging and a leakage current in the thin-film transistor TS becomes large, for example, a potential of the netA is fixed to a low level, and output of an abnormal pulse from the output terminal 51 and occurrence of an abnormal operation of a shift register due to sequential application of such an abnormal pulse to a latter stage are more effectively suppressed as compared with the fourth embodiment.

5.6 Modifications

The configuration may be such that there are provided a thin-film transistor that sets a potential of the netB1 to a low level when the fourth clock CKD is at a high level, and a thin-film transistor that sets a potential of the netB2 to a low level when the third clock CKC is at a high level, in addition to the configuration shown in FIG. 17. With this, the potential of the netB1 is securely set to the low level during the period when the fourth clock CKD is at the high level, and the potential of the netB2 is securely set to the low level during the period when the third clock CKC is at the high level. As a result, a shift of the threshold voltage of the thin-film transistors T8, T11 is suppressed.

6. Sixth Embodiment

6.1 An Overall Configuration and a Configuration of a Gate Driver

In the present embodiment, an overall configuration and a schematic configuration of a gate driver are substantially similar to the configurations in the first embodiment shown in FIGS. 2 and 3, and therefore, their detailed description is omitted. Note that, as a signal for controlling the scanning order (scanning direction) of the gate bus lines GL1 to GL8, in the first embodiment, the first to sixth scanning control signals CNT1 to CNT6 are transmitted from the display control circuit 20 to the gate driver 40, however, in the present embodiment, the first to fourth scanning control signals CNT1 to CNT4 are transmitted from the display control circuit 20 to the gate driver 40.

6.2 A Configuration of a Shift Register

FIG. 20 is a block diagram showing a configuration of a shift register 414 within the gate driver 40 in the present embodiment. As shown in FIG. 20, the shift register 414 is configured by the eight bistable circuits SR(1) to SR(8). Each bistable circuit is provided with input terminals for receiving each of two-phase clock signals CKA and CKB respectively, an input terminal for receiving a low-level power source voltage VSS, an input terminal for receiving a first set signal SET1, an input terminal for receiving a second set signal SET2, an input terminal for receiving a first reset signal RESET1, an input terminal for receiving a second reset signal RESET2, and an output terminal for outputting a scanning signal GOUT. A configuration of each stage (bistable circuit) of the shift register 414 is similar to the configuration in the first embodiment shown in FIG. 5, and therefore, its description is omitted.

In the first embodiment, as shown in FIG. 1, a signal provided to the first stage SR(1) as the second reset signal RESET2 and a signal provided to the second stage SR(2) as the second reset signal RESET2 are different from each other. Specifically, as the second reset signal RESET2, the first scanning control signal CNT1 is provided to the first stage SR(1), and the second scanning control signal CNT2 is provided to the second stage SR(2). On the other hand, in the present embodiment, as shown in FIG. 20, the first scanning control signal CNT1 is provided as the second reset signal RESET2, to both the first stage SR(1) and the second stage SR(2).

In the first embodiment, as shown in FIG. 1, a signal provided to the seventh stage SR(7) as the first reset signal RESET1 and a signal provided to the eighth stage SR(8) as the first reset signal RESET1 are different from each other. Specifically, as the first reset signal RESET1, the fifth scanning control signal CNT5 is provided to the seventh stage SR(7), and the sixth scanning control signal CNT6 is provided to the eighth stage SR(8). On the other hand, in the present embodiment, as shown in FIG. 20, the fourth scanning control signal CNT4 is provided as the first reset signal RESET1, to both the seventh stage SR(7) and the eighth stage SR(8).

6.2 An Operation of a Shift Register

Figure 21:
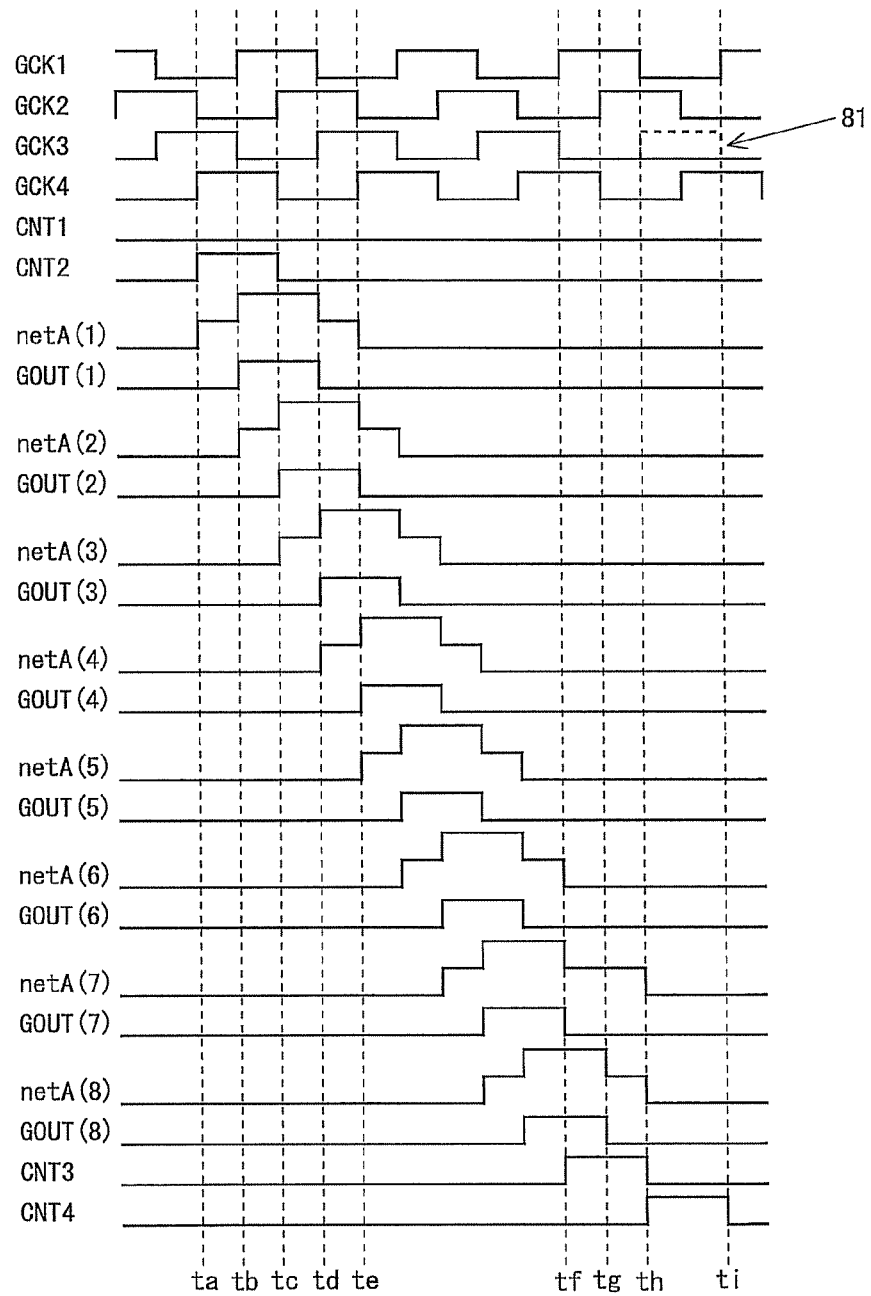
FIG. 21 is a timing chart for describing an overall operation of the shift register when a forward scanning is performed in the sixth embodiment.
Figure 22:
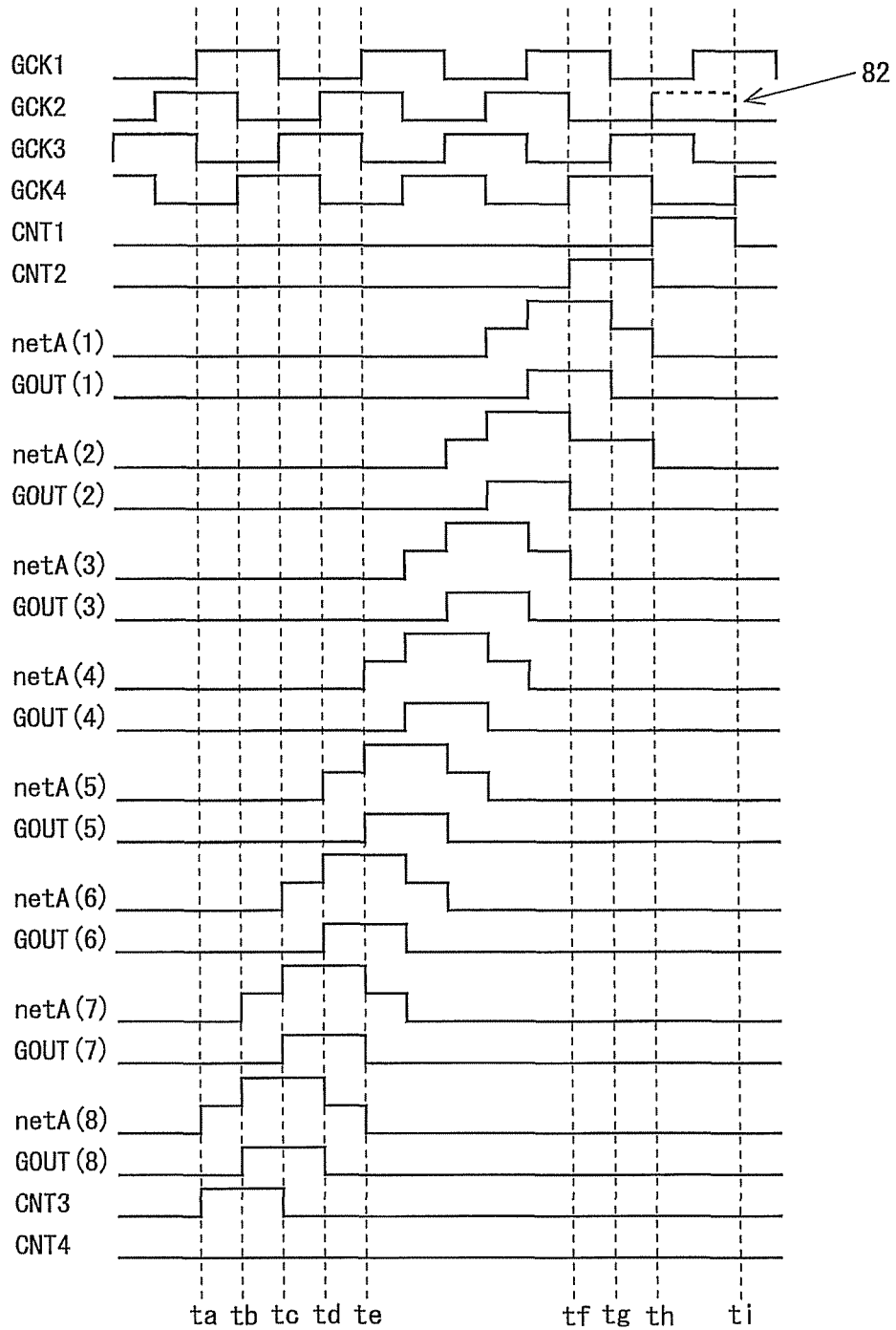
FIG. 22 is a timing chart for describing an overall operation of the shift register when a backward scanning is performed in the sixth embodiment.
Figure 23:
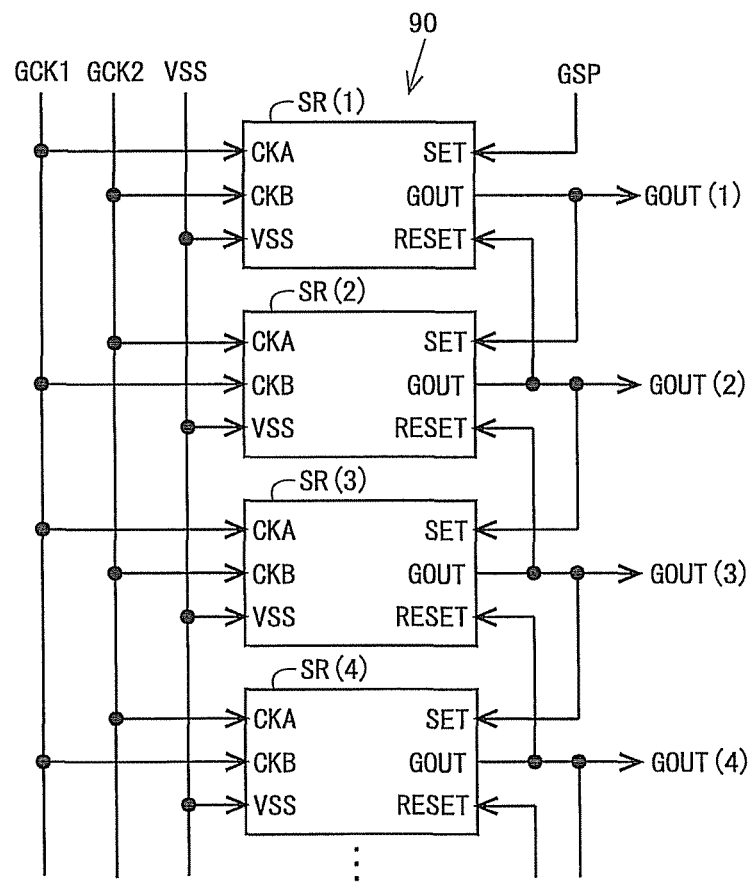
FIG. 23 is a block diagram showing an example of a configuration of a gate driver of a conventional display device.
Figure 24:
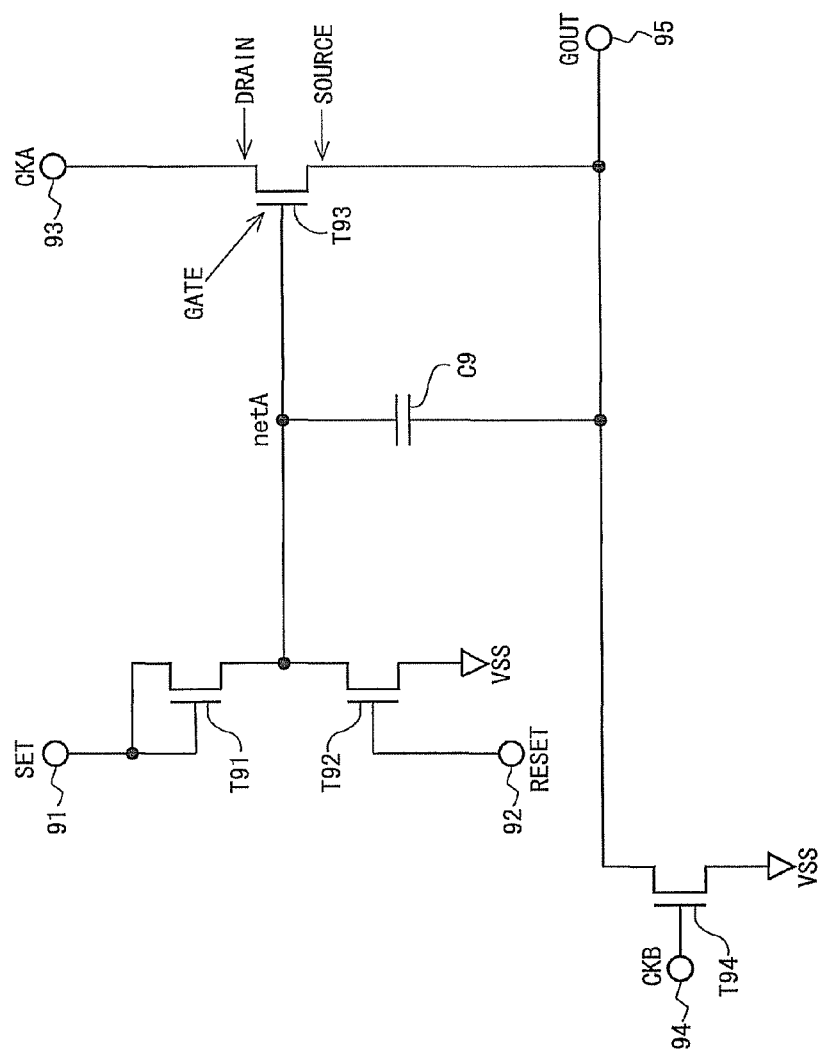
FIG. 24 is a circuit diagram showing an example of a configuration of one stage of a shift register that constitutes the gate driver in the conventional example.
Figure 25:
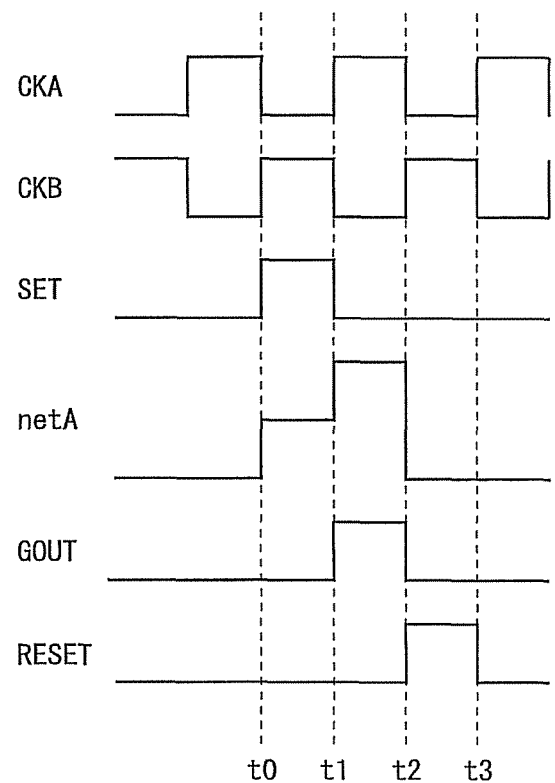
FIG. 25 is a timing chart for describing an operation of each stage of the shift register in the conventional example.
Figure 26:
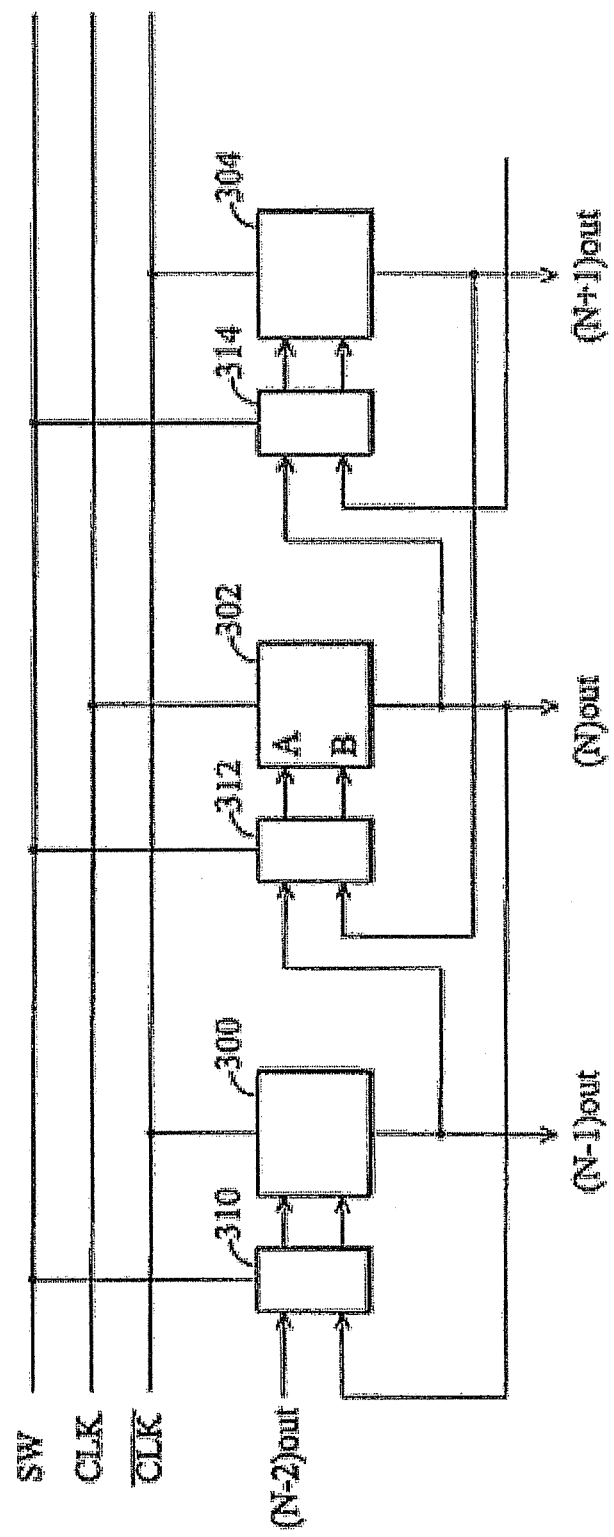
FIG. 26 is a block diagram showing a configuration of a shift register disclosed in U.S. Pat. No. 6,778,626.
Figure 27:
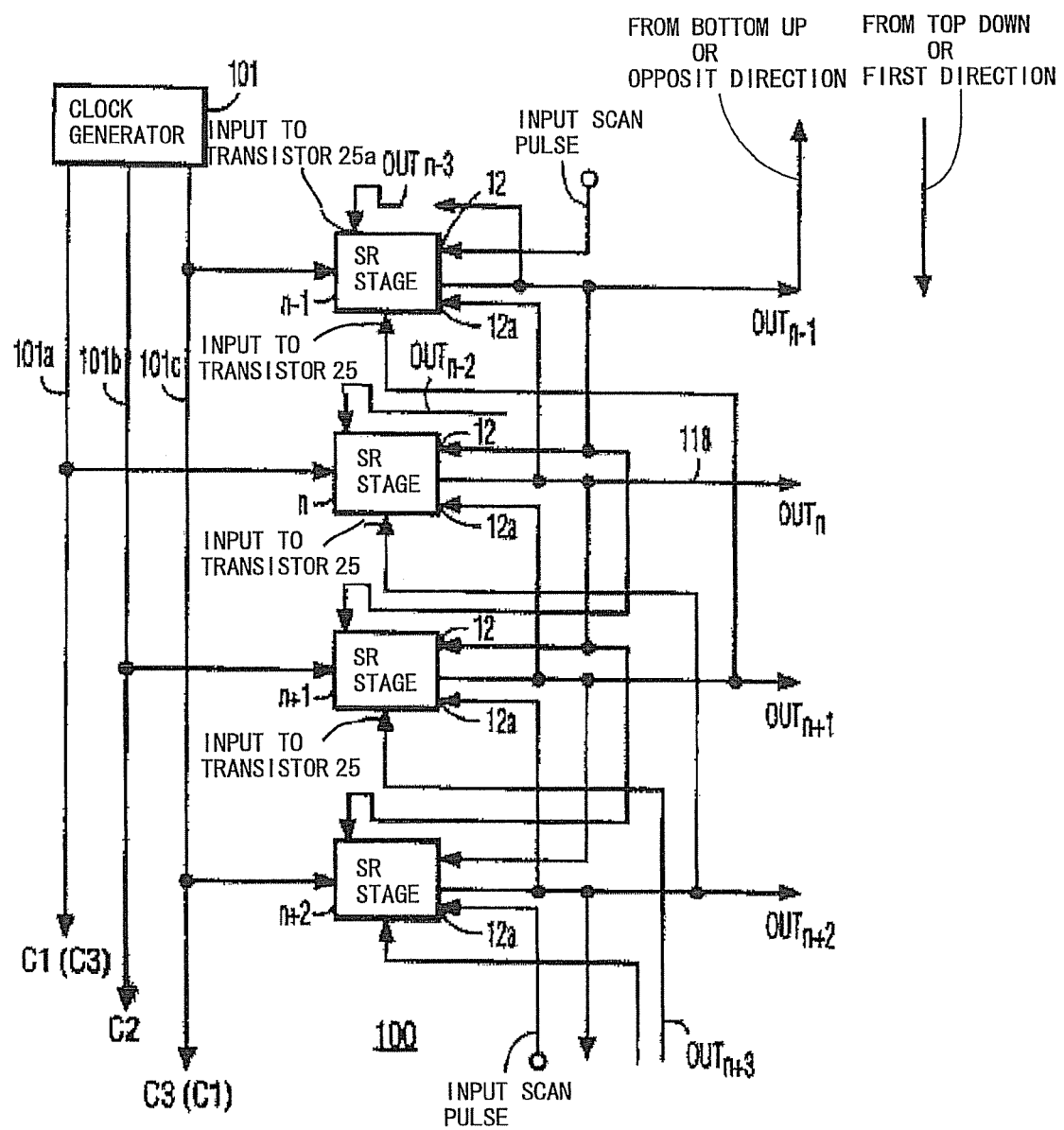
FIG. 27 is a block diagram showing a configuration of a shift register disclosed in Japanese Unexamined Patent Application Publication No. 2001-506044.
Figure 28:
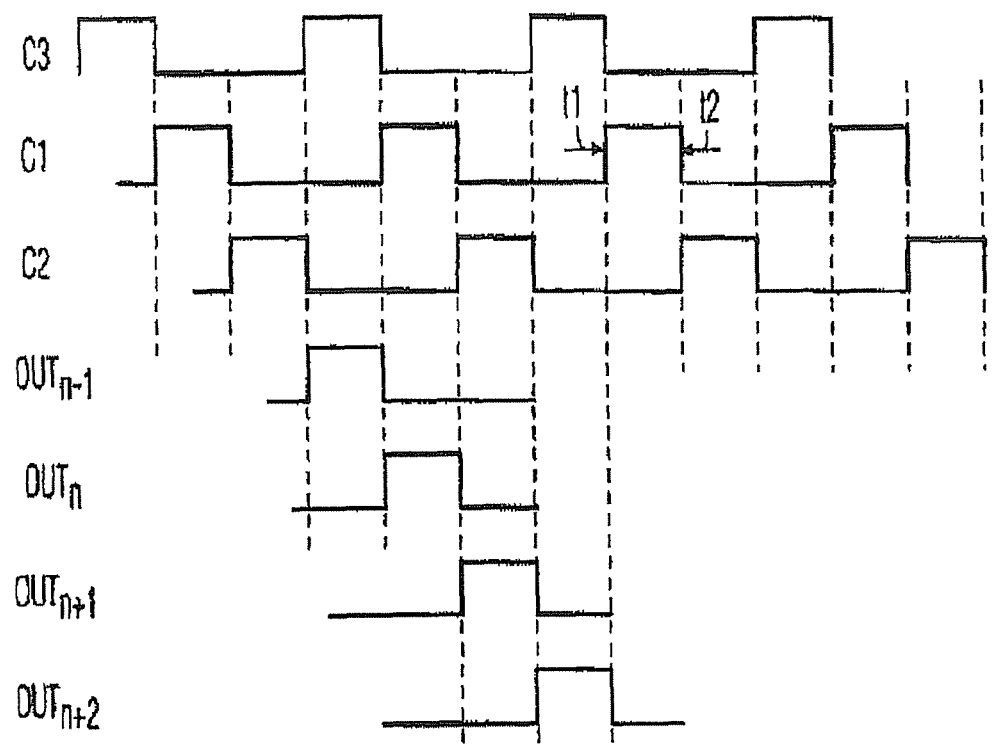
FIG. 28 is a timing chart for describing an operation of the shift register disclosed in Japanese Unexamined Patent Application Publication No. 2001-506044.

An overall operation of the shift register 414 in the present embodiment is described next. FIG. 21 is a timing chart when a forward scanning is performed, and FIG. 22 is a timing chart when a backward scanning is performed. An operation of each stage (bistable circuit) of the shift register is similar to that in the first embodiment, and therefore, its description is omitted.

An overall operation of the shift register 414 when performing the forward scanning is described. In the present embodiment, during a period before a time point tf, an operation similar to that in the first embodiment is performed. When reaching the time point tf, a pulse of the third scanning control signal CNT3 is generated, as shown in FIG. 21. The third scanning control signal CNT3 is provided to the sixth stage SR(6) as the first reset signal RESET1. Accordingly, a potential of the netA of the sixth stage SR(6) changes from the high level to a low level. At a time point tg, a pulse is not generated in the first reset signal RESET1 provided to any stage. Therefore, in any stage, the potential of the netA does not change from the high level to the low level at the time point tg. When reaching a time point th, a pulse of the fourth scanning control signal CNT4 is generated, as shown in FIG. 21. The fourth scanning control signal CNT4 is provided to the seventh stage SR(7) and the eighth stage SR(8), as the first reset signal RESET1. Accordingly, the potential of the netA of the seventh stage SR(7) and the eighth stage SR(8) changes from the high level to the low level.

An overall operation of the shift register 414 when performing the backward scanning is described. In the present embodiment, during a period before a time point tf, an operation similar to that in the first embodiment is performed. When reaching the time point tf, a pulse of the second scanning control signal CNT2 is generated, as shown in FIG. 22. The second scanning control signal CNT2 is provided to the third stage SR(3) as the second reset signal RESET2. Accordingly, the potential of the netA of the third stage SR(3) changes from the high level to the low level. At a time point tg, a pulse is not generated in the second reset signal RESET2 provided to any stage. Therefore, in any stage, the potential of the netA does not change from the high level to the low level at the time point tg. When reaching a time point th, a pulse of the first scanning control signal CNT1 is generated, as shown in FIG. 22. The first scanning control signal CNT1 is provided to the second stage SR(2) and the first stage SR(1), as the second reset signal RESET2. Accordingly, the potential of the netA of the second stage SR(2) and the first stage SR(1) changes from the high level to the low level.

When performing the forward scanning, there is a risk that the potential of the netA of the seventh stage SR(7) increases due to the bootstrap described above, when the third gate clock signal GCK changes from the low level to the high level at a timing of the time point th. Therefore, it is preferable to arrange such that the third gate clock signal GCK3 does not become at a high level during a period from the time point th to a time point t1 (see a portion indicated by an arrow marked by a reference numeral 81 in FIG. 21). Similarly, when performing the backward scanning, it is preferable to arrange such that the second gate clock signal GCK2 does not become at a high level during the period from the time point th to the time point t1 (see a portion indicated by an arrow marked by a reference numeral 82 in FIG. 22).

6.3 Effects

According to the present embodiment, the scanning order of the gate bus lines GL1 to GL8 is controlled by a smaller number of control signals than that in the first embodiment. Therefore, signal wirings are decreased, and signals to be generated in the display control circuit 20 are decreased, as compared with the first embodiment. Accordingly, reduction of a circuit area, reduction of current consumption, and cost reduction are more enhanced.

7. Others

Although the above embodiments are described by taking a liquid crystal display device as an example, the present invention is not limited to this. So far as a configuration including a shift register that can change over between scanning orders of gate bus lines is provided, the present invention can be also applied to other display devices such as an organic EL (Electro Luminescence).

DESCRIPTION OF REFERENCE CHARACTERS

10 . . . Display unit
20 . . . Display control circuit
30 . . . Source driver (video signal line drive circuit)
40 . . . Gate driver (scanning signal line drive circuit)
41 to 49 . . . Input terminal (of bistable circuit)
51 . . . Output terminal of (bistable circuit)
410 to 414 . . . Shift register
SR(1) to SR(n) . . . Bistable circuit
TS, T1 to T14 . . . Thin-film transistor
C1 . . . Capacitor
GL1 to GLn . . . Gate bus line
SL1 to SLm . . . Source bus line
CNT1 to CNT6 . . . First to sixth scanning control signals
GCK1 to GCK4 . . . First to fourth gate clock signals
CKA, CKB, CKC, CKD . . . First clock, second clock, third clock, fourth clock
GOUT(1) to GOUT(n) . . . Scanning signal
SET1 . . . First set signal
SET2 . . . Second set signal
RESET1 . . . First reset signal
RESET2 . . . Second reset signal

The invention claimed is:

1. A shift register comprising a plurality of bistable circuits each having a first state and a second state and connected in series with each other, in which the plurality of bistable circuits sequentially become in the first state based on at least four-phase clock signals including two-phase clock signals which are provided as a first clock signal and a second clock signal to odd-order stage bistable circuits out of the plurality of bistable circuits, and two-phase clock signals which are provided as the first clock signal and the second clock signal to even-order stage bistable circuits out of the plurality of bistable circuits, wherein
each bistable circuit includes:
an output node that outputs a state signal indicating either one of the first state and the second state;
an output-control switching element in which the first clock signal is provided to a second electrode, and a third electrode is connected to the output node;
a first first-node charge unit for charging a first node connected to a first electrode of the output-control switching element based on a state signal outputted from a pre-stage bistable circuit of each bistable circuit concerned;
a second first-node charge unit for charging the first node based on a state signal outputted from a next-stage bistable circuit of each bistable circuit concerned;
a first first-node discharge unit for discharging the first node based on a state signal outputted from a bistable circuit of a third stage after each bistable circuit concerned, and
a second first-node discharge unit for discharging the first node based on a state signal outputted from a bistable circuit of a third stage before each bistable circuit concerned.

2. The shift register according to claim 1, wherein a phase of the first clock signal and a phase of the second clock signal are shifted by 180 degrees from each other.

3. The shift register according to claim 1, wherein a phase of two-phase clock signals provided to the odd-order stage bistable circuits and a phase of two-phase clock signals provided to the even-order stage bistable circuits are shifted by 90 degrees from each other.

4. The shift register according to claim 1, wherein a timing when the first clock signal changes from a high level to a low level is the same as a timing when the second clock signal changes from a low level to a high level, and also a timing when the first clock signal changes from the low level to the high level is the same as a timing when the second clock signal changes from the high level to the low level.

5. The shift register according to claim 1, wherein on-duty of each of the four-phase clock signals is 50%.

6. The shift register according to claim 1, wherein
in each bistable circuit,
the first first-node charge unit includes a first switching element in which a state signal outputted from a pre-stage bistable circuit of each bistable circuit concerned is provided to a first electrode and a second electrode, and a third electrode is connected to the first node,
the second first-node charge unit includes a second switching element in which a state signal outputted from a next-stage bistable circuit of each bistable circuit concerned is provided to a first electrode and a second electrode, and a third electrode is connected to the first node,
the first first-node discharge unit includes a third switching element in which a state signal outputted from a bistable circuit of a third stage after each bistable circuit concerned is provided to a first electrode, a second electrode is connected to the first node, and a low-level potential is provided to a third electrode, and
the second first-node discharge unit includes a fourth switching element in which a state signal outputted from a bistable circuit of a third stage before each bistable circuit concerned is provided to a first electrode, a second electrode is connected to the first node, and a low-level potential is provided to a third electrode.

7. The shift register according to claim 1, wherein
each bistable circuit further includes:
a fifth switching element in which a second electrode is connected to the first node, and a low-level potential is provided to a third electrode; and
a second node control unit that controls a potential of a second node connected to a first electrode of the fifth switching element, based on the second clock signal and a potential of the first node.

8. The shift register according to claim 7, wherein
the second node control unit includes:
a sixth switching element in which the second clock signal is provided to a first electrode and a second electrode, and a third electrode is connected to the second node; and
a seventh switching element in which a first electrode is connected to the first node, a second electrode is connected to the second node, and a low-level potential is provided to a third electrode.

9. The shift register according to claim 1, wherein
the odd-order stage bistable circuits receive two-phase clock signals that are provided to the even-order stage bistable circuits, as a third clock signal and a fourth clock signal, respectively,
the even-order stage bistable circuits receive two-phase clock signals that are provided to the odd-order stage bistable circuits, as the third clock signal and the fourth clock signal, respectively, and
each bistable circuit further includes:
an eighth switching element in which a second electrode is connected to the first node, and a low-level potential is provided to a third electrode;
a third-node control unit that controls a potential of a third node connected to a first electrode of the eighth switching element, based on the third clock signal and a potential of the first node;
an eleventh switching element in which a second electrode is connected to the first node, and a low-level potential is provided to a third electrode; and
a fourth node control unit that controls a potential of a fourth node connected to a first electrode of the eleventh switching element, based on the fourth clock signal and a potential of the first node.

10. The shift register according to claim 9, wherein
the third node control unit includes
a ninth switching element in which the third clock signal is provided to a first electrode and a second electrode, and a third electrode is connected to the third node, and
a tenth switching element in which a first electrode is connected to the first node, a second electrode is connected to the third node, and a low-level potential is provided to a third electrode, and
the fourth node control unit includes
a twelfth switching element in which the fourth clock signal is provided to a first electrode and a second electrode, and a third electrode is connected to the fourth node, and
a thirteenth switching element in which a first electrode is connected to the first node, a second electrode is connected to the fourth node, and a low-level potential is provided to a third electrode.

11. The shift register according to claim 1, wherein
three first-stage-side control signals for discharging the first node included in each of bistable circuits of a first-stage, a second-stage, and a third-stage out of the plurality of bistable circuits, by the second first-node discharge unit respectively, are provided from an outside, and
three last-stage-side control signals for discharging the first node included in each of bistable circuits of a last-stage, a stage before the last stage, and a second-stage before the last stage out of the plurality of bistable circuits, by the first first-node discharge unit respectively, are provided from an outside.

12. The shift register according to claim 11, wherein
two first-stage-side control signals out of the three first-stage-side control signals are realized by one signal, and
two last-stage-side control signals out of the three last-stage-side control signals are realized by one signal.

13. The shift register according to claim 12, wherein
in each of bistable circuits of a first-stage, a second-stage, and a third-stage out of the plurality of bistable circuits, a change of the first clock signal from a low level to a high level is suppressed, during a period until the first node is discharged by the second first-node discharge unit, after the first node is charged by the second first-node charge unit, and
in each of bistable circuits of a last-stage, a stage before the last stage, and a second-stage before the last stage out of the plurality of bistable circuits, a change of the first clock signal from a low level to a high level is suppressed, during a period until the first node is discharged by the first first-node discharge unit, after the first node is charged by the first first-node charge unit.

14. The shift register according to claim 11, wherein
any one of bistable circuits of a first-stage, a second-stage, and a third-stage out of the plurality of bistable circuits includes a fifteenth switching element in which the first-stage-side control signal is provided to a first electrode, a second electrode is connected to the output node, and a low-level potential is provided to a third electrode, and
any one of bistable circuits of a last-stage, a stage before the last stage, and a second-stage before the last stage out of the plurality of bistable circuits includes a sixteenth switching element in which the last-stage-side control signal is provided to a first electrode, a second electrode is connected to the output node, and a low-level potential is provided to a third electrode.

15. The shift register according to claim 1, wherein each bistable circuit further includes a fourteenth switching element in which the second clock signal is provided to a first electrode, a second electrode is connected to the output node, and a low-level potential is provided to a third electrode.

16. The shift register according to claim 1, wherein each bistable circuit further includes a capacitor in which one end is connected to the first node, and the other end is connected to the output node.

17. The shift register according to claim 1, wherein each bistable circuit further includes a seventeenth switching element in which a state signal outputted from a bistable circuit of a second stage or a third stage after each bistable circuit concerned is provided to a first electrode, a second electrode is connected to the output node, and a low-level potential is provided to a third electrode, and an eighteenth switching element in which a state signal outputted from a bistable circuit of a second stage or a third stage before each bistable circuit concerned is provided to a first electrode, a second electrode is connected to the output node, and a low-level potential is provided to a third electrode.

18. The shift register according to claim 1, wherein the shift register is formed by using amorphous silicon.

19. The shift register according to claim 1, wherein the shift register is formed by using microcrystalline silicon.

20. The shift register according to claim 1, wherein the shift register is formed by using polycrystalline silicon.

21. The shift register according to claim 1, wherein the shift register is formed by using an oxide semiconductor.

22. A scanning signal line drive circuit of a display device, for driving a plurality of scanning signal lines that are provided in a display unit, comprising:
   the shift register according to claim 1, wherein
   the plurality of bistable circuits are provided so as to have a one-to-one correspondence with the plurality of scanning signal lines, and
   each bistable circuit provides a state signal outputted from the output node, to a scanning signal line corresponding to each bistable circuit concerned as a scanning signal.

23. A display device comprising the scanning signal line drive circuit according to claim 22, including the display unit.

24. The display device according to claim 23, wherein a shift register including the plurality of bistable circuits is provided at both one end side and the other end side of the display unit, respectively.

25. The display device according to claim 23, wherein the odd-order stage bistable circuits are provided at one end side of the display unit, and the even-order stage bistable circuits are provided at the other end side of the display unit.

26. The shift register according to claim 21, wherein the oxide semiconductor is an In—Ga—Zn based oxide (IGZO).

* * * * *